US011899372B2

(12) United States Patent
Mizuno et al.

(10) Patent No.: US 11,899,372 B2
(45) Date of Patent: Feb. 13, 2024

(54) OPTICAL DEVICE, EXPOSURE DEVICE, METHOD FOR MANUFACTURING FLAT PANEL DISPLAY, AND METHOD FOR MANUFACTURING DEVICE

(71) Applicant: NIKON CORPORATION, Tokyo (JP)

(72) Inventors: Yasushi Mizuno, Saitama (JP); Masaki Kato, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/859,140

(22) Filed: Jul. 7, 2022

(65) Prior Publication Data
US 2023/0004094 A1 Jan. 5, 2023

Related U.S. Application Data

(63) Continuation of application No. PCT/JP2021/000578, filed on Jan. 8, 2021.

(60) Provisional application No. 62/959,178, filed on Jan. 10, 2020.

(51) Int. Cl.
*G03F 7/00* (2006.01)

(52) U.S. Cl.
CPC ................ *G03F 7/70191* (2013.01)

(58) Field of Classification Search
CPC ............ G03F 7/70191; G03F 7/70208; G03F 7/70275; G03F 7/7055; B23K 26/0622
See application file for complete search history.

(56) References Cited

U.S. PATENT DOCUMENTS

| 7,755,658 B2 * | 7/2010 | Nagase ............... G02B 27/0938 347/256 |
| 2006/0139609 A1 | 6/2006 | Baselmans et al. |
| 2009/0073407 A1 * | 3/2009 | Okita .................. G03F 7/70075 355/53 |
| 2019/0113741 A1 * | 4/2019 | Kito .................... G03F 7/70791 |

FOREIGN PATENT DOCUMENTS

| JP | 2004-245911 A | 9/2004 |
| JP | 2006-049635 A | 2/2006 |
| JP | 2006-191063 A | 7/2006 |
| JP | 2009-521108 A | 5/2009 |
| WO | 2007/071408 A1 | 6/2007 |

OTHER PUBLICATIONS

Mar. 16, 2021 International Search Report issued in International Patent Application No. PCT/JP2021/000578.
Mar. 16, 2021 Written Opinion issued in International Patent Application No. PCT/JP2021/000578.
Jun. 27, 2023 Office Action issued in Japanese Patent Application No. 2021-570119.

* cited by examiner

*Primary Examiner* — Hung V Nguyen
(74) *Attorney, Agent, or Firm* — Oliff PLC

(57) ABSTRACT

An optical device includes a plurality of laser light sources, an output module having an optical modulator, and a time divider that is disposed between the plurality of laser light sources and the output module and that is configured to divide laser beams emitted from the plurality of laser light sources in time.

19 Claims, 38 Drawing Sheets

FIG. 26
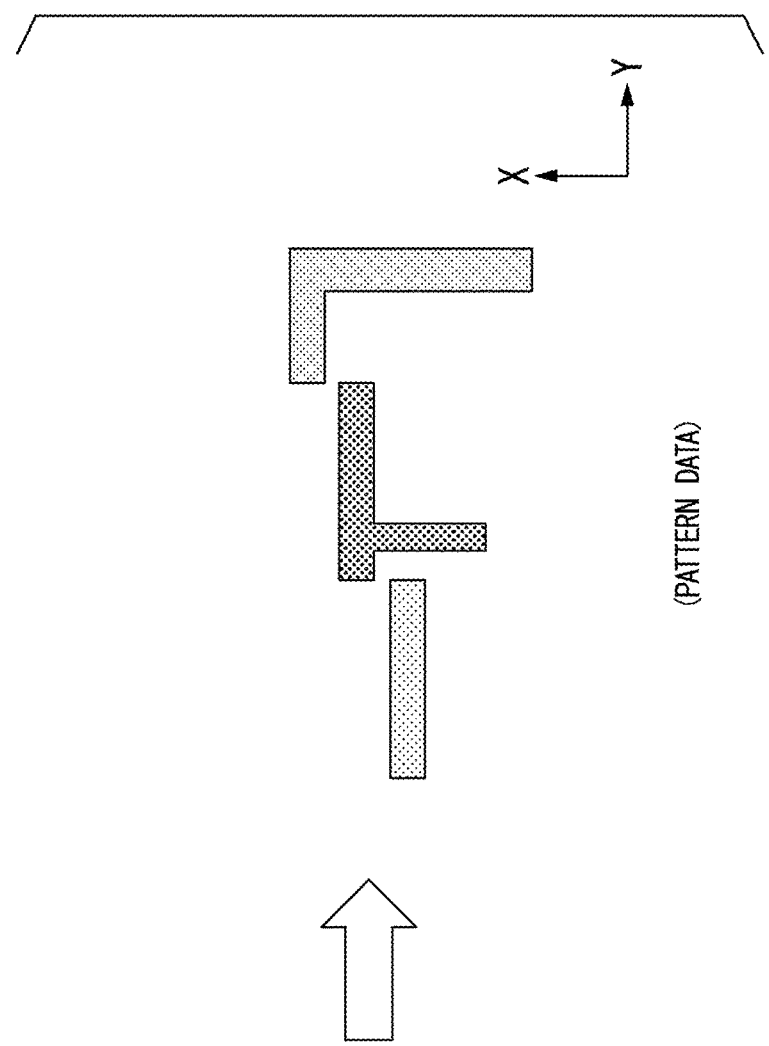
(PATTERN DATA)
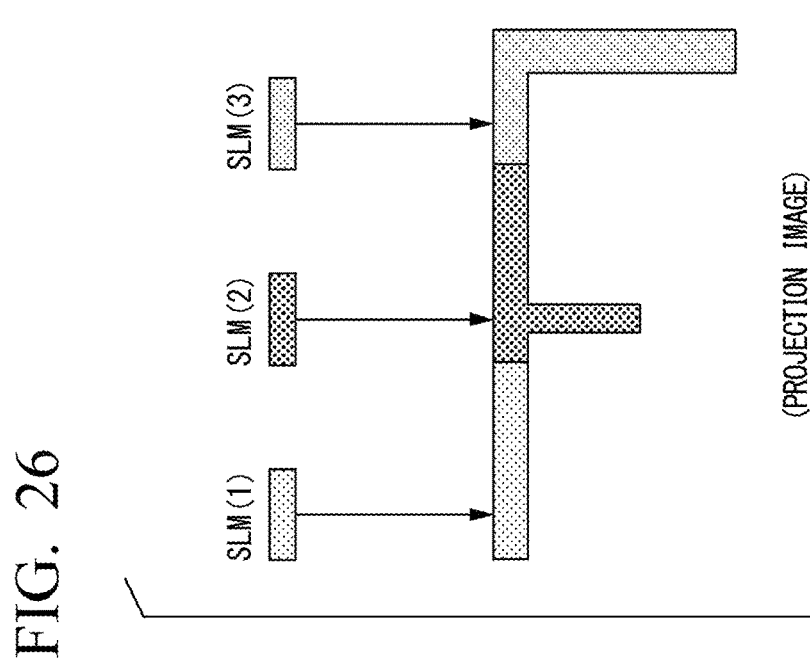
(PROJECTION IMAGE)

OPTICAL DEVICE, EXPOSURE DEVICE, METHOD FOR MANUFACTURING FLAT PANEL DISPLAY, AND METHOD FOR MANUFACTURING DEVICE

CROSS-REFERENCE TO RELATED APPLICATION

The present application is a continuation application of International Application PCT/JP2021/000578, filed on Jan. 8, 2021, which claims priority on U.S. Patent Provisional Application No. 62/959,178, filed on Jan. 10, 2020. The contents of the above applications are incorporated herein by reference.

BACKGROUND

Technical Field

The present invention relates to an optical device including a laser light source, an exposure device, a method for manufacturing a flat panel display, and a method for manufacturing a device.

Laser beams are used in various fields.

In a device that uses a laser beam, improvement of processing accuracy and improvement of energy efficiency are constantly desired. For example, reduction of energy loss of a laser beam, appropriate control of output intensity of a laser beam, suppression of speckles, appropriately control of a beam output timing, and/or appropriate control of an output beam waveform is desired.

SUMMARY

In an aspect of the present invention, an optical device includes a plurality of laser light sources; an output module having an optical modulator; and a time divider which is disposed between the plurality of laser light sources and the output module and which is configured to divide laser beams emitted from the plurality of laser light sources in time.

In another aspect of the present invention, an optical device includes a plurality of laser light sources; a plurality of output modules each having an optical modulator; and a time divider which is disposed between the plurality of laser light sources and the plurality of output modules and which is configured to divide laser beams emitted from the plurality of laser light sources in time.

In another aspect of the present invention, an optical device includes a plurality of laser light sources; a plurality of output modules each having an optical modulator; a time divider which is disposed between the plurality of laser light sources and the plurality of output modules and which is configured to divide laser beams emitted from the plurality of laser light sources in time; and a subsidiary divider disposed between the plurality of laser light sources and the time divider or between the time divider and the plurality of output modules.

In another aspect of the present invention, an optical device includes a laser light source; an output module; and a time divider which is disposed between the laser light source and the output module and which is configured to divide a laser beam emitted from the laser light source in time. The time divider divides the laser beam using a plurality of reflecting surfaces.

In another aspect of the present invention, an optical device includes a laser light source; a plurality of output modules; and a time divider which is disposed between the laser light source and the plurality of output modules and which is configured to divide a laser beam emitted front the laser light source in time. The time divider divides the laser beam using a plurality of reflecting surfaces.

In another aspect of the present invention, an optical device includes a laser light source; an output module having an optical modulator; and an acousto-optic device disposed between the light source and the output module.

In another aspect of the present invention, an optical device includes a laser light source; a plurality of output modules each having an optical modulator; and an acousto-optic device disposed between the laser light source and the output module.

In another aspect of the present invention, an optical device includes a laser light source configured to emit pulse light; an output module having an optical modulator; a time divider which is disposed between the laser light source and the output module and which is configured to divide the pulse light in time; and a controller configured to control division of the pulse light by the time divider on the basis of a frequency of the pulse light.

In another aspect of the present invention, an optical device includes a laser light source configured to emit pulse light; a plurality of output modules each having an optical modulator; a time divider which is disposed between the laser light source and the plurality of output modules and which is configured to divide the pulse light in time; and a controller configured to control division of the pulse light by the time divider on the basis of a frequency of the pulse light.

BRIEF DESCRIPTION OF THE DRAWINGS

FIG. 26 is a view for describing shift adjustment corresponding to a scan operation.

DESCRIPTION OF THE EMBODIMENTS

Hereinafter, an embodiment of the present invention will be described with reference to the accompanying drawings. The following detailed description of the present invention is merely exemplary and is not limiting. The same or similar reference signs are used throughout the drawings and the following detailed description.

Figure 1:
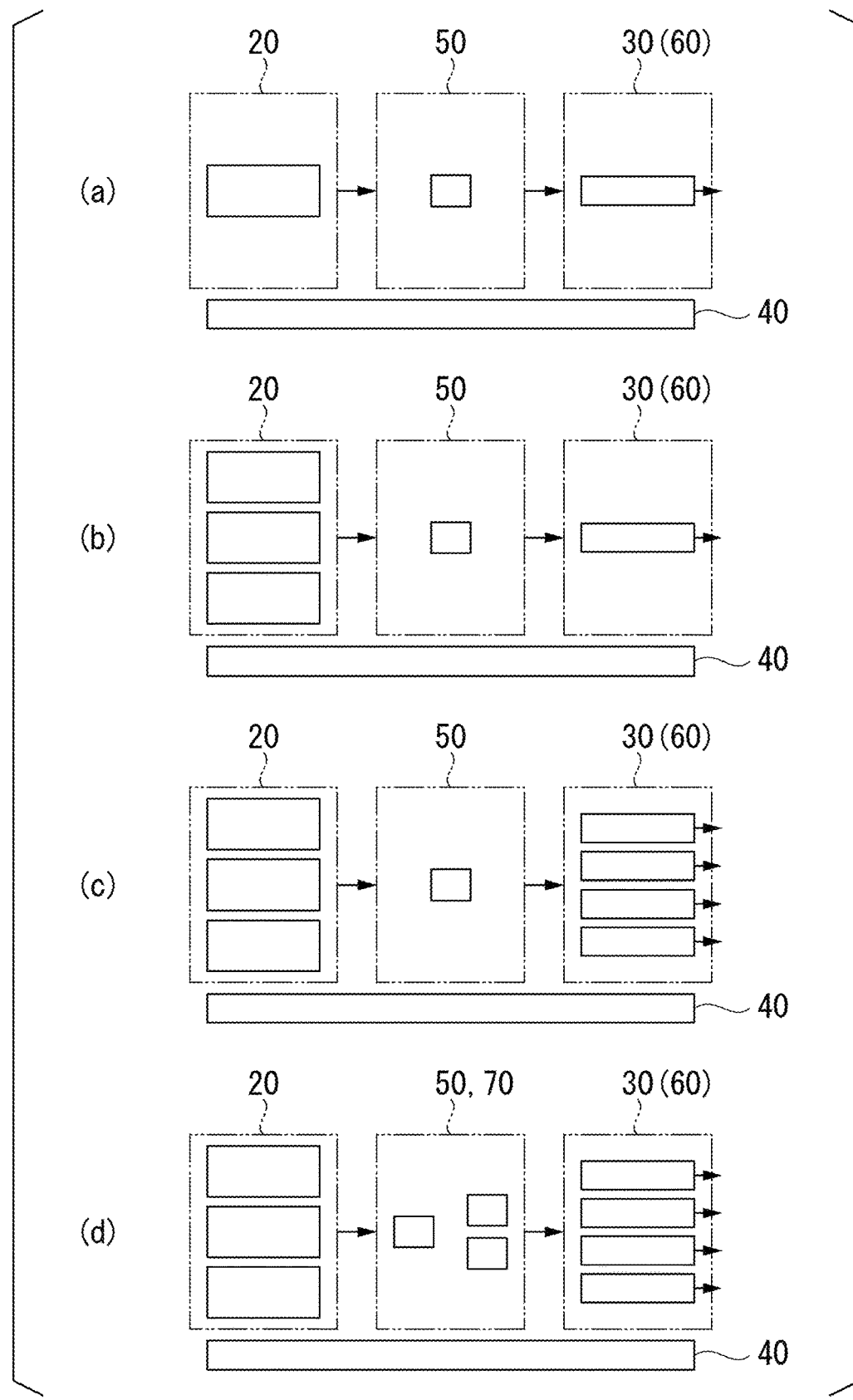
FIG. 1 is a schematic diagram representing various form examples of a laser beam system (optical device) including a laser light source.
Figure 2:
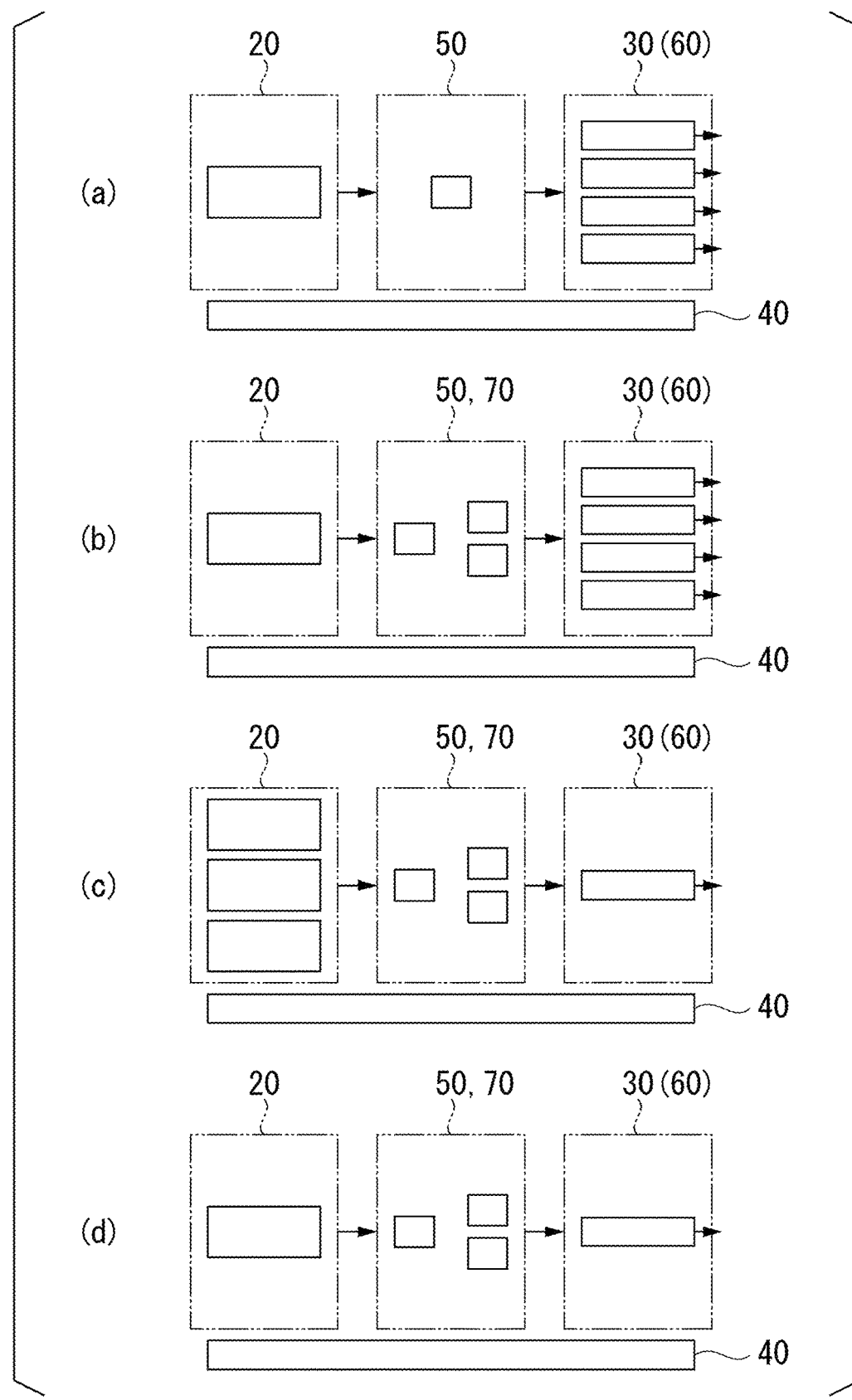
FIG. 2 is a schematic diagram representing various other form examples of the laser beam system (optical device) including the laser light source.

FIG. 1 and FIG. 2 are schematic diagrams showing various form examples of a laser beam system (optical device) including a laser light source. In each of the examples of FIG. 1(a), FIG. 1(b), FIG. 1(c), FIG. 1(d). FIG. 2(a), FIG. 2(b), FIG. 2(c), and FIG. 2(d), the laser beam system includes a laser light source 20.

In the embodiment, the laser beam system (optical device) includes the laser light source 20, an output module 30, a controller 40, and a time divider 50 optically disposed between (optically between) the laser light source 20 and the output module 30.

Various types can be applied to the laser light source 20. For example, a gas laser (a He—Ne laser, an argon laser, a carbon dioxide gas laser, an excimer laser, a nitrogen laser, or the like), a semiconductor laser, a solid-state laser (an YAG laser, a neodymium (Nd) laser, a ruby laser, a fiber laser, a titanium laser or the like), a metal laser (a copper vapor deposition laser, a helium cadmium laser, a gold vapor deposition laser, or the like), a liquid laser, or the like is exemplified as the laser light source 20. The technology of the present disclosure can be applied to various oscillation types such as pulse oscillation, continuous wave (CW) oscillation, and the like.

The output module 30 is set according to a purpose of the laser beam. For example, the laser beam is used for an optical device such as a laser machining device, a laser melting device, a laser welding device, a laser marking device, a laser measuring device, a semiconductor exposure device, a flat panel display exposure device, a circuit substrate exposure device, a laser illumination device, a laser display device, a laser detection device, a laser propulsion device, a laser inspection device, a laser microscope, a laser medical device, or the like. The technology of the present disclosure can be applied to devices in various fields including these devices.

In a specific embodiment, the output module 30 includes a spatial light modulator (SLM) 60. For example, the SLM 60 includes a liquid crystal element, a digital mirror device (digital micro-mirror device, DMD), a magneto optic spatial light modulator (MOSLM), or the like.

The time divider (a time distributor, a dynamic time divider, an optical time divider, an optical switch, an optical shutter, a dynamic switch, a dynamic shutter, a dynamic separator, or an optical path switching machine) 50 is controlled by the controller 40 and configured to divide the laser beam in time. For example, a polygon mirror device, a galvanometer mirror device, an electro-optical modulator (EOM), an acousto-optic modulator (AOM), a vibration device, another optical switch device (liquid crystal switch or the like), or the like is exemplified as the time divider 50. The time-divided beam can be selectively used. Further, the plurality of time-divided beams can be synthesized, mixed, and/or converged. For example, the beam selectively extracted from the time divider 50 enters the output module 30. In one example, the time-divided beam is guided to a plurality of optical paths for each predetermined span on a time axis. The plurality of time-divided beams (plurality of distributed beams) are supplied to each of the plurality of paths.

In a specific embodiment, the time divider 50 is controlled to be driven synchronously with the SLM 60 of the output module 30. For example, the time-divided beam corresponding to a driving timing of the SLM 60 is supplied to the SLM 60. For example, in general, the operation frequency (for example, an image updating frequency) of the SLM 60 is lower than a repeating frequency of the pulse beam. Among the time-divided beams, the beam corresponding to the operation timing of the SLM 60 is selectively used. The remaining time-divided beams may be used for another purpose. In another embodiment, the time divider 50 can be controlled to be driven non-synchronously with the SLM 60 of the output module 30.

In a specific embodiment, the laser beam system includes a plurality of laser light sources 20. The number of the laser light sources 20 may be arbitrarily set. For example, the number of the laser light sources 20 may be 2, 3, 4, 5, 6, 7, 8, 9, 10, 11, 12, 13, 14, 15, 16, 17, 18, 19, 20, or more. In one example, the beams from the plurality of laser light sources 20 are synthesized, mixed, and/or converged via a predetermined device, and enter the time divider 50. The beams from the plurality of laser light sources 20 may have a relatively high energy value even after they are divided by the time divider 50. In another example, the beams from the plurality of laser light sources 20 enter the time divider 50 independently. In one example, the beams from the plurality of pulse laser light sources 20 are set such that pulse widths and peak values (pulse waveforms, waveform profiles) are substantially the same as each other. In another example, the beams from the plurality of pulse laser light sources 20 are set such that at least one of the pulse widths and peak values (pulse waveforms, waveform profiles) are different from each other.

In a state in which the plurality of laser light sources 20 and the output module 30 having the SLM 60 are combined with each other, for example, energy loss of the laser beam is reduced, energy efficiency is improved, output intensity of the laser beam is appropriately controlled, and/or speckles are suppressed. In one example, the beams from the time divider 50 are supplied to the SLM 60 at an appropriate timing. In the SLM 60 to which the beams are limitedly supplied for an appropriate time, a high energy beam (high power beam) is output from the output module 30 together with reduction in energy loss in the SLM 60.

In a specific embodiment, the laser beam system includes a plurality of output modules 30. For example, a first time-divided beam is supplied to the first output module 30, and a second time-divided beam is supplied to the second output module 30. The number of the output modules 30 may be arbitrarily set. For example, the number of the output modules 30 may be 2, 3, 4, 5, 6, 7, 8, 9, 10, 11, 12, 13, 14, 15, 16, 17, 18, 19, 20, 25, 30, 35, 40, 45, 50, or more.

In a specific embodiment, each of the plurality of output modules 30 has the SLM 60. The plurality of SLMs 60 are driven synchronously or non-synchronously. In one example, the first, second, third and fourth SLMs 60 are driven at the same timing corresponding to a certain time-divided beam. In another example, the first and second SLMs 60 are driven at the same timing corresponding to the first time-divided beam, and the third and fourth SLMs 60 are driven at another timing corresponding to the second time-divided beam. In still another example, the first SLM 60 is driven at a timing corresponding to the first time-divided beam, the second SLM 60 is driven at another timing corresponding to the second time-divided beam, the third SLM 60 is driven at still another timing corresponding to the third time-divided beam, and the fourth SLM 60 is driven at yet another timing corresponding to the fourth time-divided beam.

In a state in which the time divider 50 and the plurality of SLMs 60 are combined, for example, energy loss of the laser beam is reduced, energy efficiency is improved, output intensity of the laser beam is appropriately controlled, the beam output timing is appropriately controlled, and/or the output beam waveform is appropriately controlled. In one example, the beams from laser light source 20 are guided to the plurality of SLMs 60 to correspond to the driving timings of each of the plurality of SLMs 60. Reduction in shading period (beam nonuse period) of the beam is advantageous for improvement of energy efficiency, reduction in leak light, and/or avoidance of thermal effects.

In a specific embodiment, the laser beam system further includes a subsidiary divider (a time distributor, a dynamic time divider, an optical time divider, an optical switch, an optical shutter, a dynamic switch, a dynamic shutter, a dynamic separator, an optical path switching machine) 70 disposed optically between the laser light source 20 and the time divider 50 or optically between the time divider 50 and the output module 30. The subsidiary divider 70 includes a dynamic divider or a static divider, and is configured to perform polarization separation, frequency separation, or separation in time of the laser beam. The dynamic divider is a configuration for separating or dividing the laser beam according to the driving of the divider, and the static divider is a configuration for separating or dividing the laser beam without driving the divider. For example, the same device as the above-mentioned time divider or the like can be applied as the dynamic divider. For example, a polarization beam splitter, a half mirror, a dichroic mirror, a frequency separator, or the like is exemplified as the static divider. In one example, the time divider 50 and the static divider 70 are sequentially disposed on the optical axis in a direction in which the beam advances. In another example, the static divider 70 and the time divider 50 are sequentially disposed on the optical axis in the direction in which the beam advances. Further, in another example, the time divider (a front position, a front stage time divider) 70 and the time divider (a rear position, a rear stage time divider) 50 are sequentially disposed on the optical axis in the direction in which the beam advances. In an example, the plurality of time dividers 50 and 70 are combined. In another example, the time divider 50 and the plurality of static dividers 70 are combined. In yet another example, the plurality of time dividers 50 and the one static divider 70 are combined. In still another example, the plurality of time dividers 50 and the plurality of static dividers 70 are combined. The number of the time dividers 50 and the number of the subsidiary dividers 70 may be arbitrarily set. For example, a total number of the time dividers 50 and the subsidiary dividers 70 may be 2, 3, 4, 5, 6, 7, 8, 9, 10, 11, 12, 13, 14, 15, 16, 17, 18, 19, 20, or more.

In a state in which the time dividers 50 and the static dividers 70 are combined, for example, energy loss of the laser beam is reduced, energy efficiency is improved, output intensity of the laser beam is appropriately controlled, a beam output timing is appropriately controlled, and/or an output beam waveform is appropriately controlled. In one example, a division number of the beam is increased, and/or the beam is divided into a plurality of beams according to a wavelength bandwidth.

In a state in which the time divider (front position) 70 and the time divider (rear position) 50 are combined, for example, energy loss of the laser beam is reduced, energy efficiency is improved, output intensity of the laser beam is appropriately controlled, a beam output timing is appropriately controlled, and/or an output beam waveform is appropriately controlled. In one example, a division number of the beam is increased, and/or use of a non-stable zone and/or a non-suitable zone in the time divider is avoided while the energy loss is suppressed.

In one example, the time-divided beam from the front position time divider 70 in the first span on the time axis enters the rear position time divider 50, and a stable zone and/or a suitable zone of the rear position time divider 50 is preferentially and/or appropriately (specifically and/or preferentially) used. Meanwhile, in the second span on the time axis, the time-divided beam from the front position time divider 70 does not enter the rear position time divider 50 substantially, and use of the non-stable zone and/or the non-suitable zone of the rear position time divider 50 is avoided. For example, by alternately supplying the time-divided beams to the first time divider 50 and the second time divider 50 at the rear position, use of the non-stable zone and/or the non-suitable zone in the time divider 50 is avoided while substantially continuously using the beams. In other words, each of the plurality of rear position time dividers 50 has a stable zone (suitable zone) and a non-stable zone (non-suitable zone). The plurality of rear position time dividers 50 are driven such that the stable state upon driving becomes different timings. The time-divided beam from the front position time divider 70 is parted to match the stable state of each of the time dividers 50 at the rear position.

In a specific embodiment, the output module 30 has an optical fiber. The optical fiber is configured to receive a plurality of time-divided beams from the time divider 50 or the subsidiary divider 70. In one example, one optical fiber is provided with respect to one output module 30. In another example, a plurality of optical fibers are provided with respect to one output module 30. In this example, the plurality of time-divided beams from the plurality of optical fibers enter the one output module 30.

In a specific embodiment, the laser beam system has the plurality of output modules 30. Each of the plurality of output modules 30 includes a fiber. For example, the time-divided beam at the first timing is supplied to the first optical fiber, and the time-divided beam at the second timing is supplied to the second optical fiber. In one example, one optical fiber is provided with respect to each of the plurality of output modules 30. In another example, a plurality of optical fibers are provided with respect to each of the plurality of output modules 30. In this example, the plurality of time-divided beams from the plurality of optical fibers enter each of the plurality of output modules 30.

Figure 3:
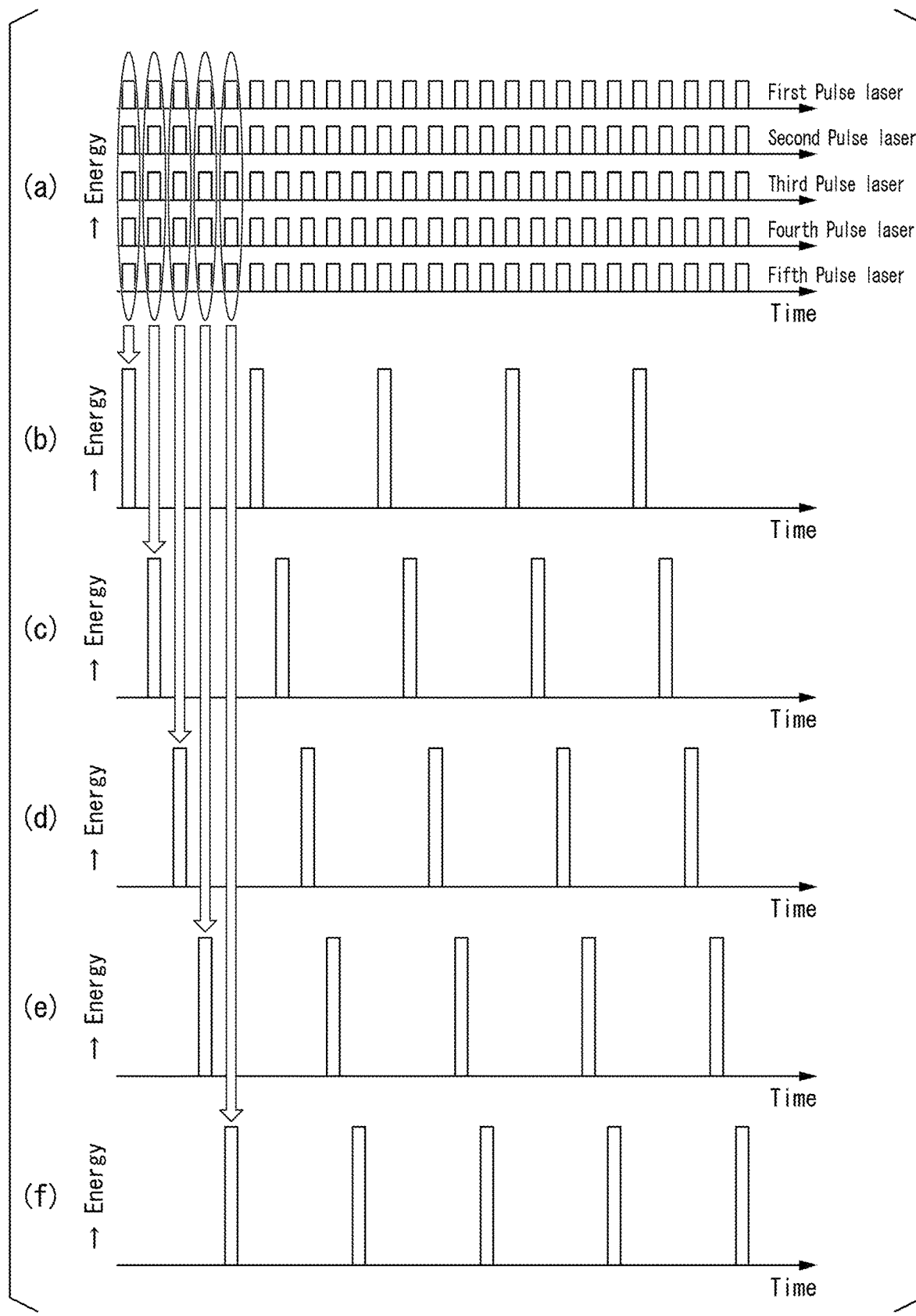
FIG. 3 is a view showing an example of synthesis control of a pulse laser beam.
Figure 4:
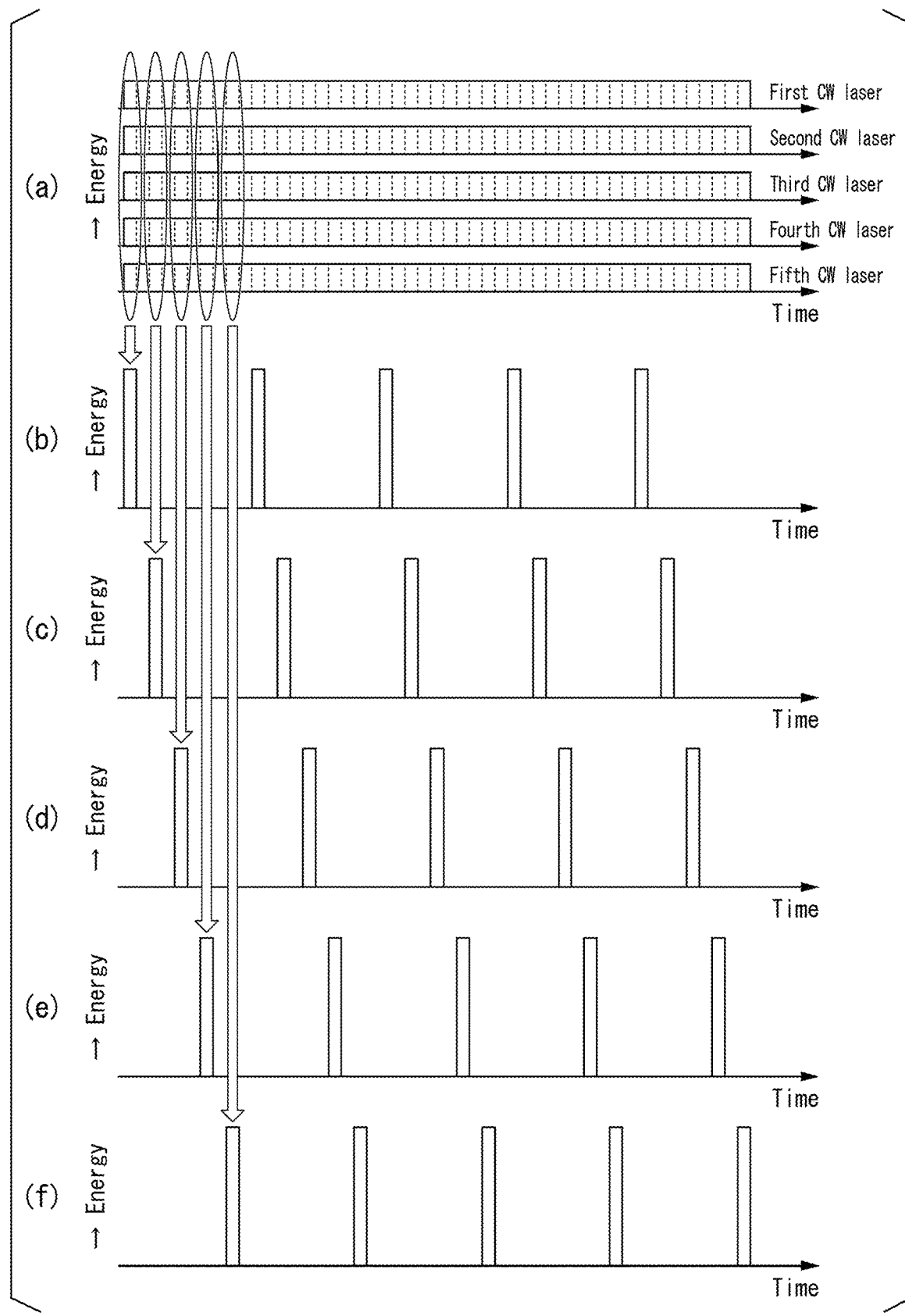
FIG. 4 is a view showing an example of synthesis control of a CW laser beam.
Figure 5:
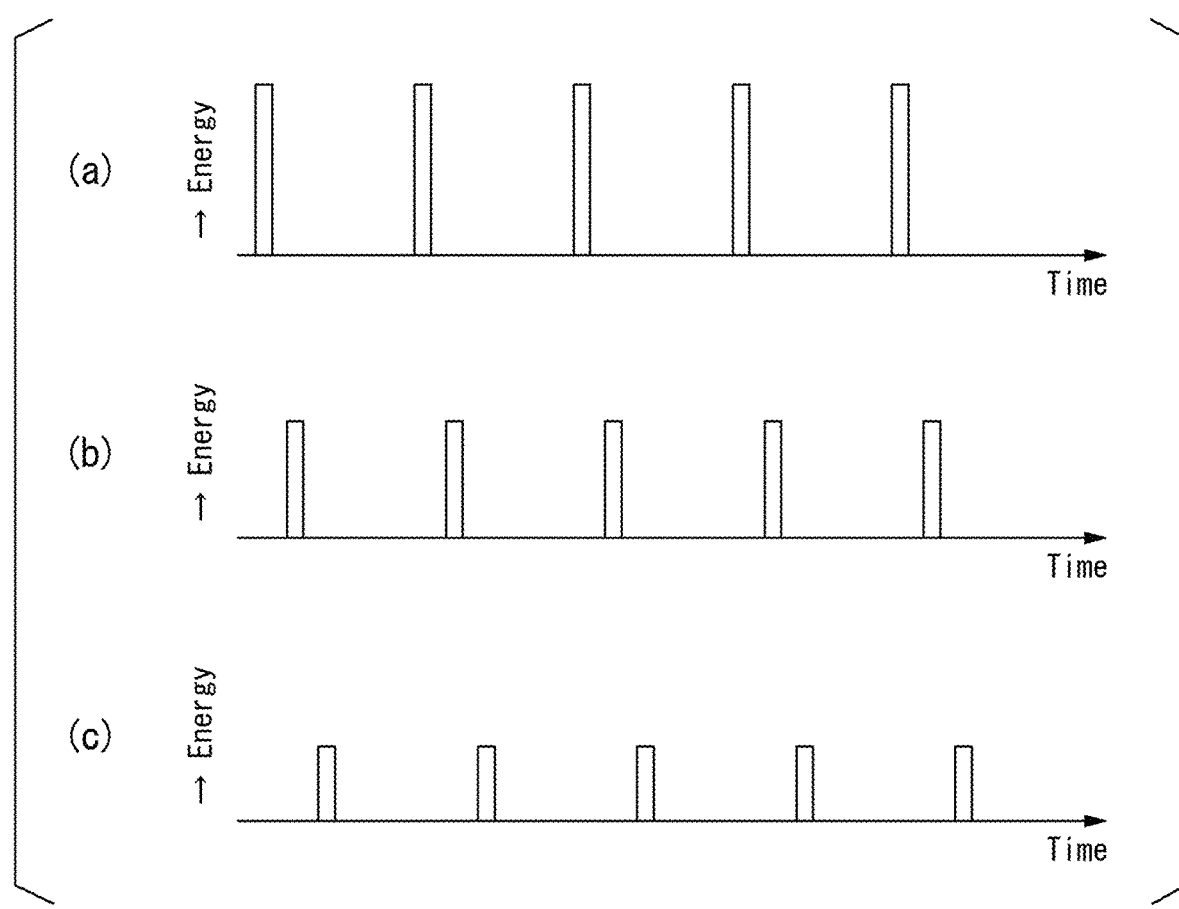
FIG. 5 is a view showing an example of an output beam.
Figure 6:
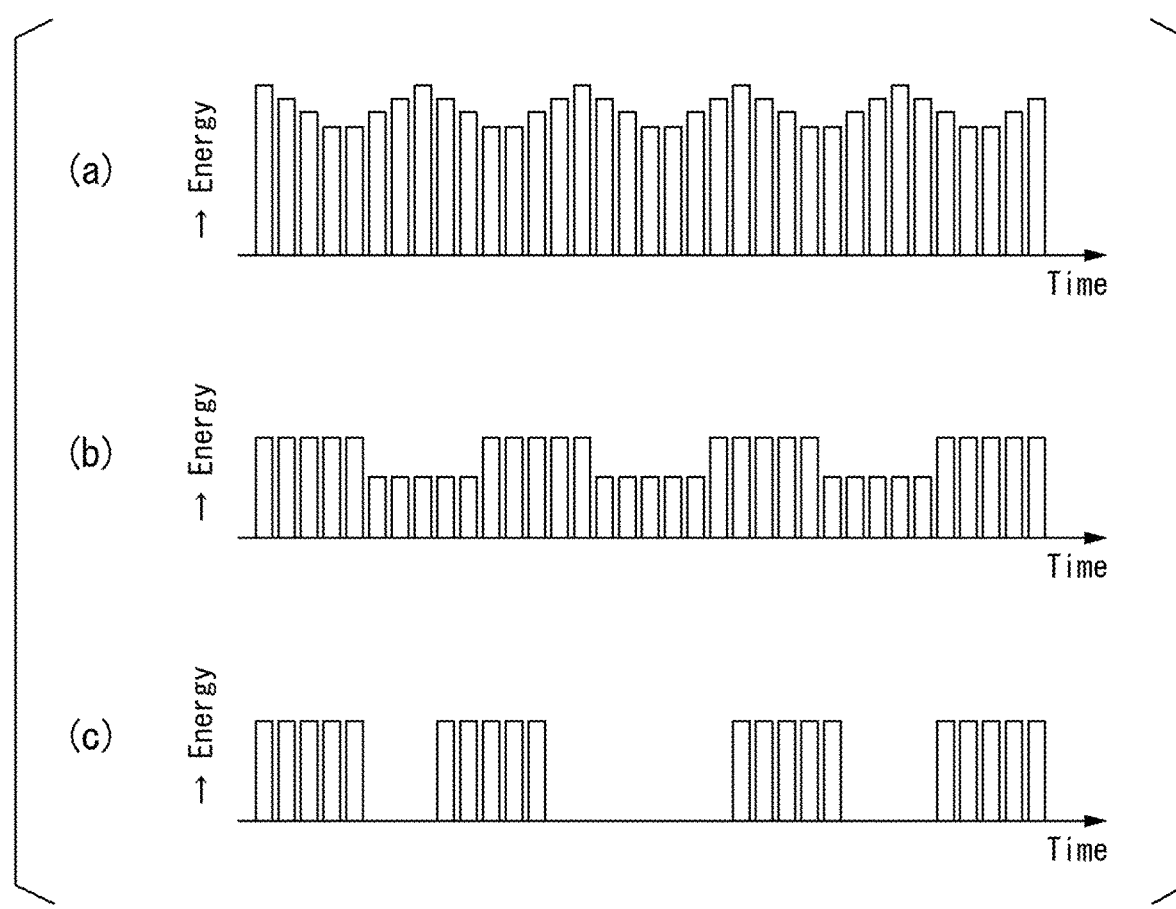
FIG. 6 is a view showing another example of the output beam.

FIG. 3 is a view showing an example of synthesis control of the pulse laser beam. FIG. 4 is a view showing an example of synthesis control of a CW laser beam. FIG. 5 and FIG. 6 are views showing examples of an output beam. In each example, the laser beam, power of which was controlled, is output from the laser beam system.

In one example, the plurality of laser beams emitted from the plurality of laser light sources 20 are synthesized. The synthesis can be performed by an optical system including a lens, a beam splitter, a halving, a mirror, or the like. The synthesized laser beam enters the time divider 50, a synthesis beam (a synthesis beam of a first pulse) corresponding to the first repeating timing is guided to a first optical fiber 80 via the time divider 50 (FIG. 3(*b*), FIG. 4(*b*)). A synthesis beam (a synthesis beam of a second pulse) corresponding to the second repeating timing is guided to a second optical fiber 80 via the time divider 50 (FIG. 3(*c*), FIG. 4(*c*)). A synthesis beam (a synthesis beam of a third pulse) corresponding to the third repeating timing is guided to a third optical fiber 80 via the time divider 50 (FIG. 3(*d*), FIG. 4(*d*)). A synthesis beam (a synthesis beam of a fourth pulse) corresponding to the fourth repeating timing is guided to a fourth optical fiber 80 via the time divider 50 (FIG. 3(*e*), FIG. 4(*e*)). A synthesis beam (a synthesis beam of a fifth pulse) corresponding to the fifth repeating timing is guided to a fifth optical fiber 80 via the time divider 50 (FIG. 3(*f*), FIG. 4(*f*)). The first, second, third, fourth and fifth repeating timings are sequentially shifted in time. Accordingly, a high energy (high power) synthesis beam is guided to each of the optical fibers 80. For example, in the output module 30 having the SLM 60, a synthesis beam is guided to the optical fiber 80 according to the operation timing of the SLM 60 at a relatively low speed.

In another example, the output power can be controlled to differ between the plurality of output modules 30 according to an application of the combination of the time division and the synthesis. For example, a relatively high energy (high power) beam is output from the first output module 30 (FIG. 5(*a*)). An intermediate energy (intermediate power) beam is output from the second output module 30 (FIG. 5(*b*)). A relatively low energy (low power) beam is output from the third output module 30 (FIG. 5(*c*)).

In further another example, the output beam waveform from the one or plurality of output modules 30 is appropriately controlled according to the application of the combination of the time division and the synthesis (FIG. 6(*a*), (*b*)). And/or, the beam output timing from the one or plurality of output modules 30 is appropriately controlled (FIG. 6(*c*)).

In a specific embodiment, a rotation device (rotation switch) is applied as the time divider 50. A rotation device 50 is rotation-controlled by the controller 40, and configured to divide the laser beam in time.

Figure 7:
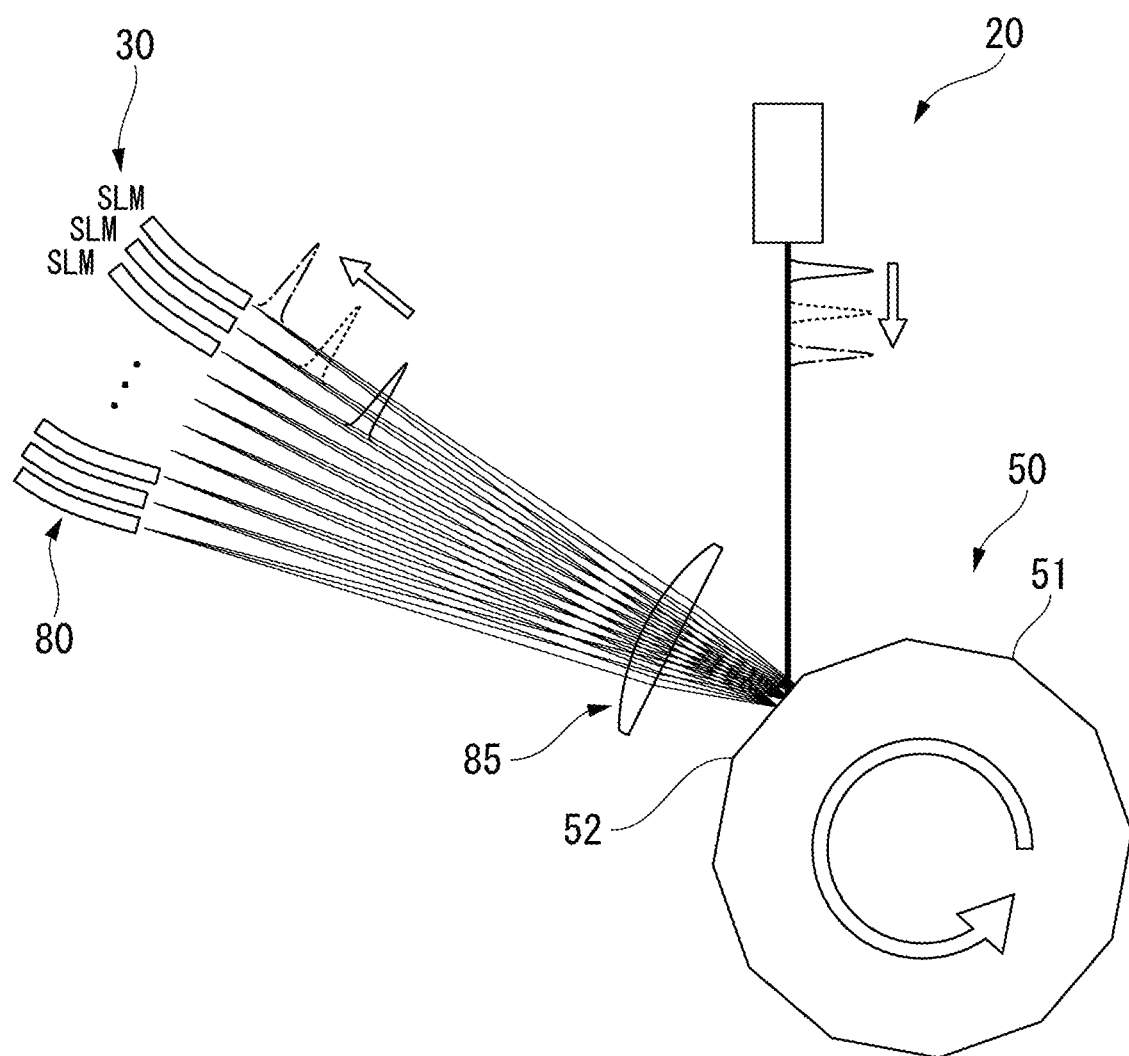
FIG. 7 is a view showing an example in which a polygon mirror device is applied as a time divider (rotation device).
Figure 8:
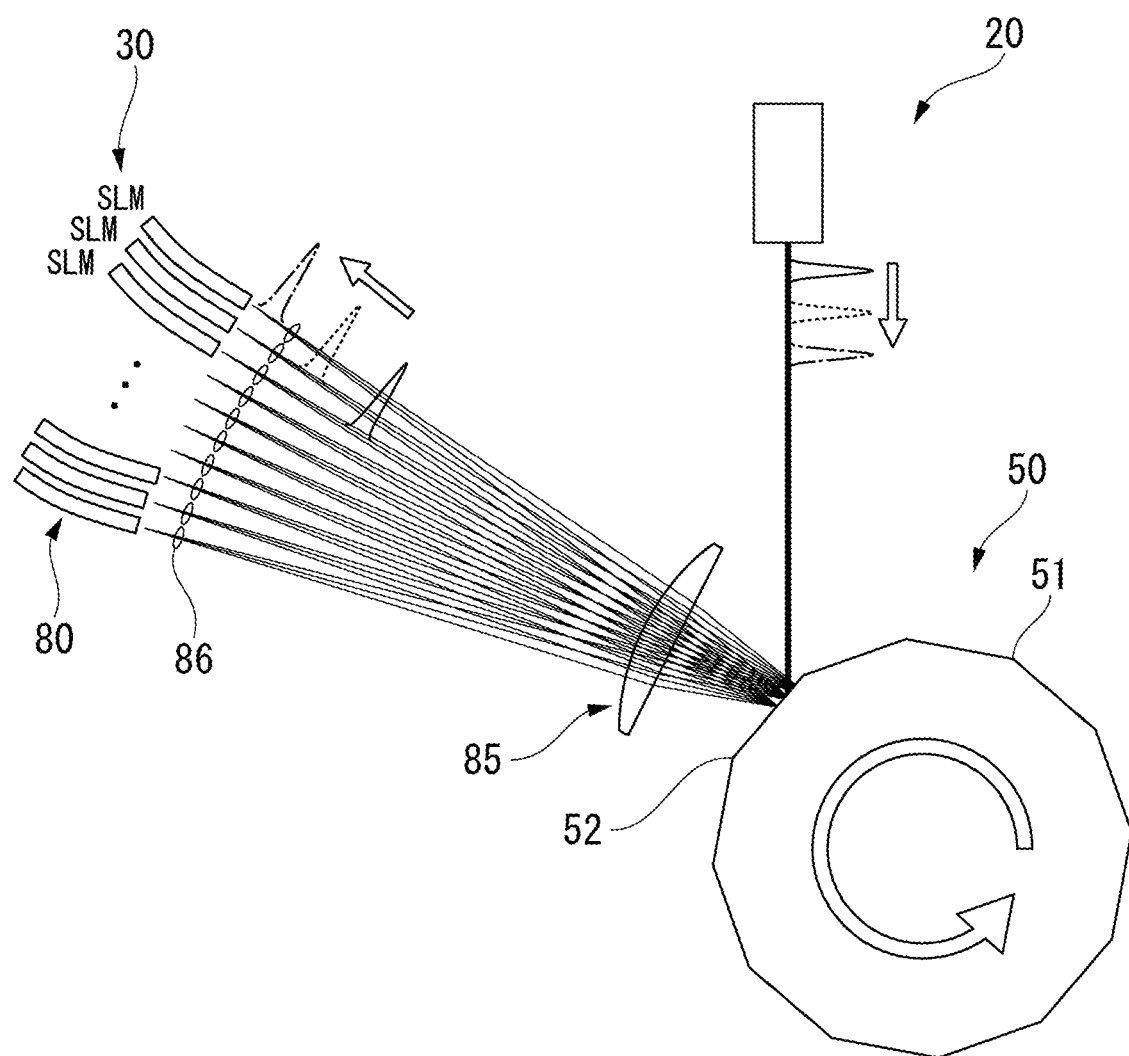
FIG. 8 is a view showing an example in which a polygon mirror device is applied as a time divider (rotation device).

In one example, a polygon mirror device is applied as the rotation device 50 (FIG. 7). The beam from the laser light source 20 is reflected by each of a plurality of reflecting surfaces 52 of a polygon mirror 51 in a polygon mirror device 50. Each of a plurality of output modules 30 has an optical fiber 80 having an inlet section. In the polygon mirror device 50, the beam is divided in time according to a rotation angle of the polygon mirror 51. The beam reflected by the polygon mirror 51 is directed to any one inlet section (incidence surface) of the plurality of optical fibers 80 according to the rotation angle of the polygon mirror 51. That is, an angle of the reflecting surface of the polygon mirror 51 with respect to the beam changes according to rotation of the polygon mirror 51, and a destination of the beam reflected by the reflecting surface changes according to lapse of time. For this reason, a beam with a first pulse from the laser light source 20 enters the first optical fiber, and a beam with a second pulse enters the second optical fiber, a position of which is different from that of the first optical fiber. The number of optical fibers 80 may be disposed with respect to the one polygon mirror 51. The time-divided beam from the polygon mirror 51 is parted to any one of the plurality of optical fibers 80. In other words, the polygon mirror 51 switches the optical fiber through which the beam enters. In addition, in other words, the polygon mirror 51 switches a position of the optical path of the beam. At least one lens 85 or 86 is disposed between the polygon mirror 51 and the optical fiber 80 according to necessity (FIG. 8). For example, when the inlet section (incidence surface) of the optical fiber 80 and the reflecting surface of the polygon mirror 51 are conjugated, a deviation (positional deviation) of the incidence position of the beam with respect to the optical fiber 80 based on the rotation of the polygon mirror 51 is suppressed. Further, a slight change of the incidence angle of the beam with respect to the optical fiber 80 on the basis of the rotation of the polygon mirror 51 is advantageous for suppression of the speckles. Instead of the pulse beam, a CW beam can also be applied to this type similarly.

Figure 9:
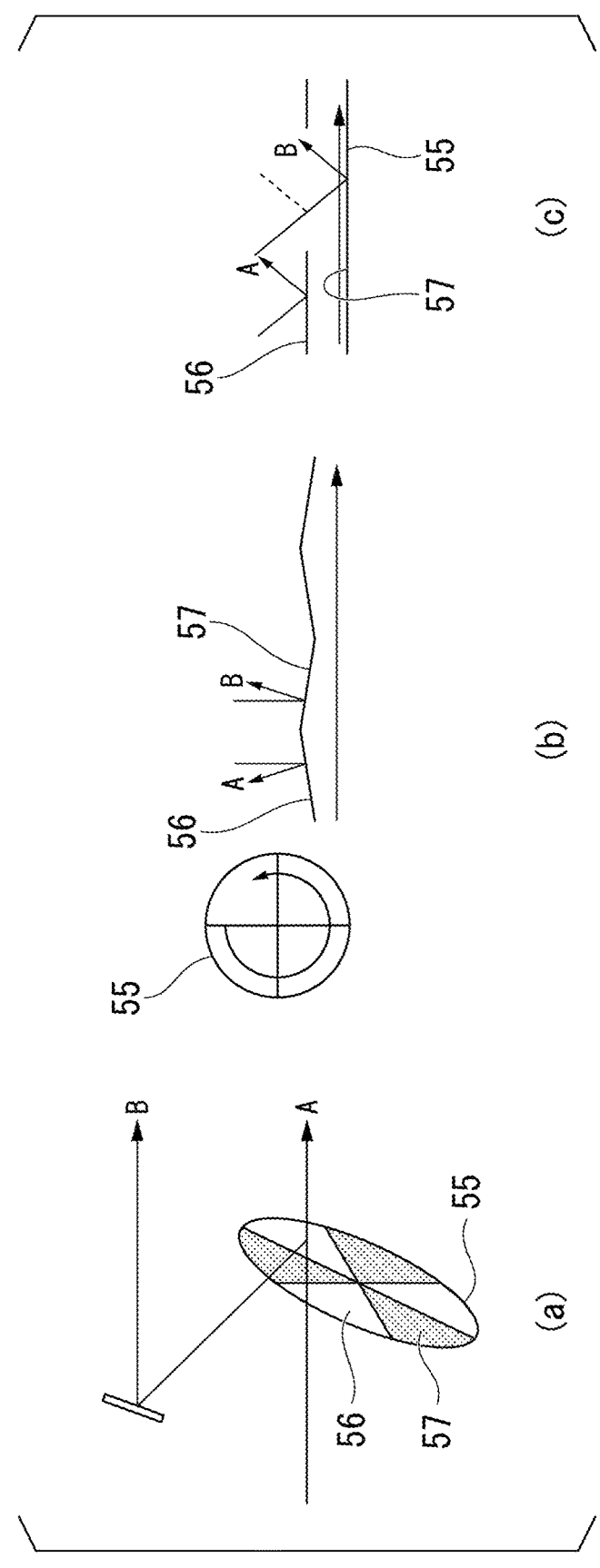
FIG. 9 is a view showing an example in which an optical switch device is applied as a time divider (rotation device).
Figure 10:
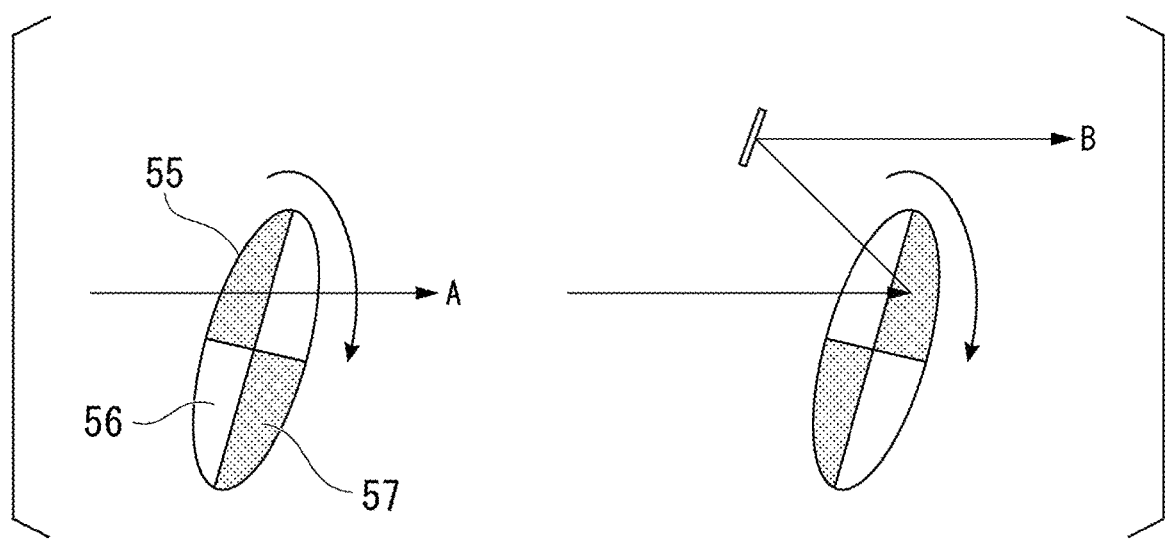
FIG. 10 is a view showing an example in which an optical switch device is applied as a time divider (rotation device).

In another example, a disk-shaped optical switch device is applied as the rotation device 50 (FIG. 9). In the disk-shaped optical switch device 50, the beam is divided in time according to a rotation angle of a rotation plate 55. For example, the beam from the laser light source 20 is reflected by or transmitted through optical surfaces 56 and 57 of the rotation plate 55 in the optical switch device 50 according to the rotation angle of the rotation plate 55 (FIG. 9(*a*)). The rotation plate 55 has the transmission surface 56 and the reflecting surface 57 arranged in the circumferential direction. For example, the beam passing through the rotation plate 55 is directed toward a first path "A," and the beam reflected by the rotation plate 55 is directed toward a second path "B" (FIG. 10). In addition, for example, the beam from the laser light source 20 is reflected by the optical surfaces 56 and 57 of the rotation plate 55 in different directions in the optical switch device 50 according to the rotation angle of the rotation plate 55 (FIG. 9(*b*)). The rotation plate 55 has the first reflecting surface 56 and the second reflecting surface 57, orientations of which are different from each other. For example, the beam reflected by the first reflecting surface 56 of the rotation plate 55 is directed toward the first path "A." and the beam reflected by the second reflecting surface 57 of the rotation plate 55 is directed toward the second path "B." In addition, for example, the beam from the laser light source 20 is reflected at different height positions of the rotation plate 55 according to the rotation angle of the rotation plate 55 (FIG. 9(*c*)). The rotation plate 55 has the first reflecting surface 56 and the second reflecting surface 57 having different height positions in a rotation axis direction. For example, the beam reflected by the first reflecting surface 56 of the rotation plate 55 is directed toward the first path "A," and the beam passing through the first reflecting surface of the rotation plate 55 and reflected by the second reflecting surface 57 is directed toward the second path "B." Further, a beam division number in the rotation type optical switch device 50 is not limited to 2. The division number may be 3, 4, 5, 6, 7, 8, 9, 10, or more. For example, the rotation plate 55 may have three or more reflecting surfaces, orientations of which are different from each other.

Figure 11:
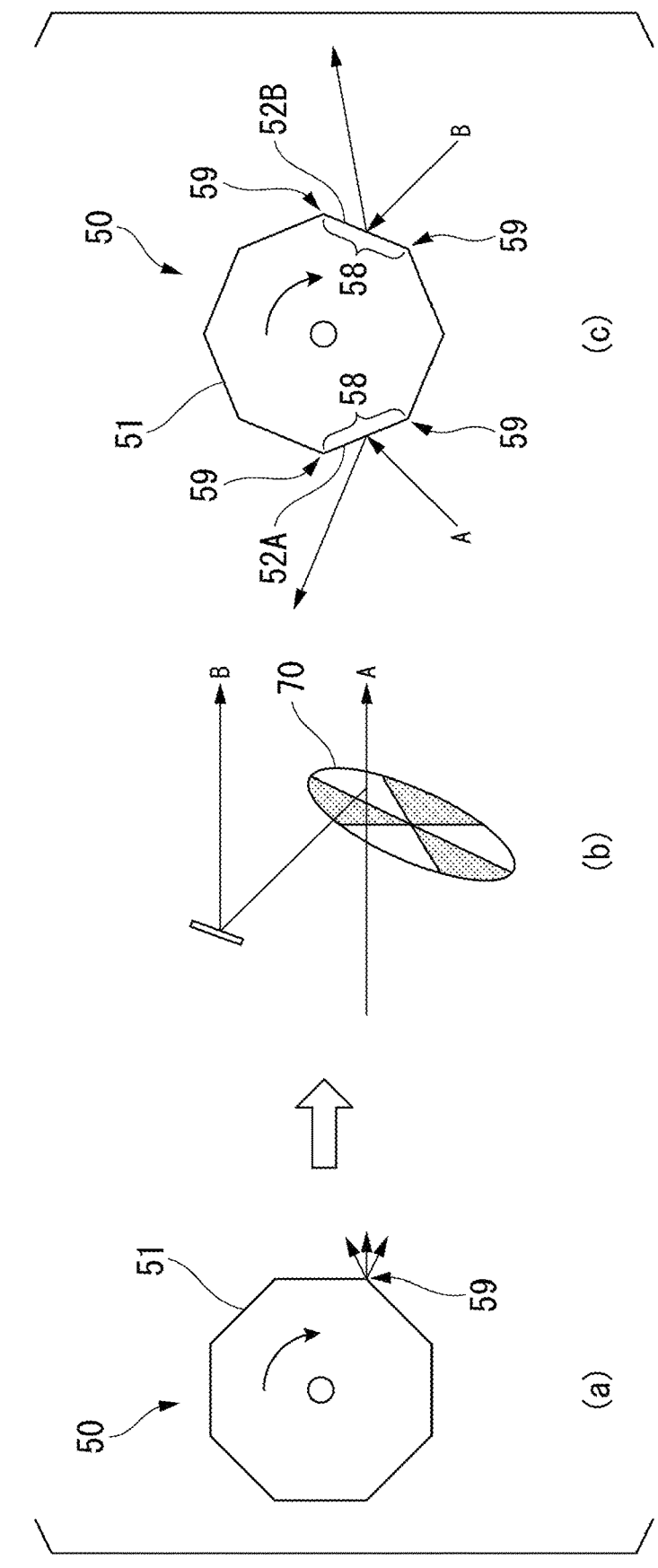
FIG. 11 is a view showing an example in which an optical switch device is applied as a subsidiary divider (dynamic time divider) and a polygon mirror device is applied as a time divider (dynamic time divider).

In a specific embodiment, the above-mentioned disk-shaped optical switch device is applied as the subsidiary divider (dynamic time divider) 70, and the polygon mirror device is applied as the time divider (dynamic time divider) 50 (FIG. 11). In this type, use of a corner portion (corner) of the polygon mirror 51 as a non-stable zone and/or non-suitable zone 59 can be avoided. For example, the beam from the optical switch device 70 in the first span on the time axis is directed toward a first position in a reflecting surface 52 of the polygon mirror device 50 via the path "A," and preferentially and/or appropriately (specifically and/or preferentially) reflected and time-divided by a stable zone 58 of the polygon mirror 51 (a reflecting surface 52A). The beam from the optical switch device 70 in the second span on the time axis is directed toward the reflecting surface 52B different from the reflecting surface 52A of the polygon mirror device 50 via the path "B," and preferentially and/or appropriately (specifically and/or preferentially) reflected and time-divided by the stable zone 58 of the polygon mirror 51 (the reflecting surface 52B). The beams are alternately supplied to the reflecting surface 52A and the reflecting surface 52B of the polygon mirror 51. In the first time span, the beam does not enter the reflecting surface 52B, and use of a portion where the non-stable zones (corner portions) 59 of the polygon mirror 51 (the reflecting surface 52A), i.e., the reflecting surface and the reflecting surface that form the polygon mirror 51 intersect each other (boundary portion) is avoided. In the second time span, the beam does not enter the reflecting surface 52A, and use of the non-stable zone (corner portion) 59 of the polygon mirror 51 (the reflecting surface 52B) is avoided. Use of the non-stable zone in the polygon mirror 51 (the time divider 50) is avoided while the beam is substantially continuously used according to the parting of the time-divided beam. Avoidance of the use of the non-stable zone in the polygon mirror 51 (the time divider 50) will be described below in detail. Further, the reflecting surface 52A and the reflecting surface 52B are changed over time by the rotation of the polygon mirror 51. That is, the reflecting surface 52A is a surface where the beam enters the polygon mirror device 50 via the path "A." In addition, the reflecting surface 52B is a surface where the beam enters the polygon mirror device 50 via the path "B."

Figure 12:
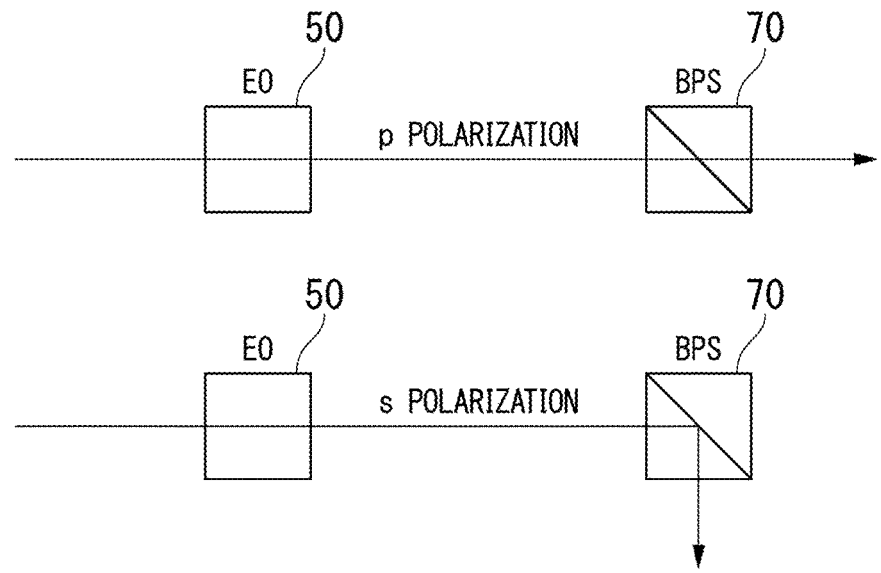
FIG. 12 is a view showing an example in which an electro-optical modulator is applied as a time divider and a polarization beam splitter is applied as a subsidiary divider (static divider).

In a specific embodiment, an electro-optical modulator (EOM, EO) is applied as the time divider 50, and a polarization beam splitter (PBS) is applied as the subsidiary divider (static divider) 70 (FIG. 12). In one example, the EOM 50 and the PBS 70 are sequentially disposed on the optical axis in a direction in which the beam advances. In this type, the beam from the EOM 50 is branched off into a plurality of beams according to a wavelength bandwidth by the PBS 70. For example, a p-polarization beam of the time-divided beam from the EOM 50 passes through the PBS 70. An s-polarization beam of the time-divided beam from the EOM 50 is reflected by the PBS 70.

Figure 13:
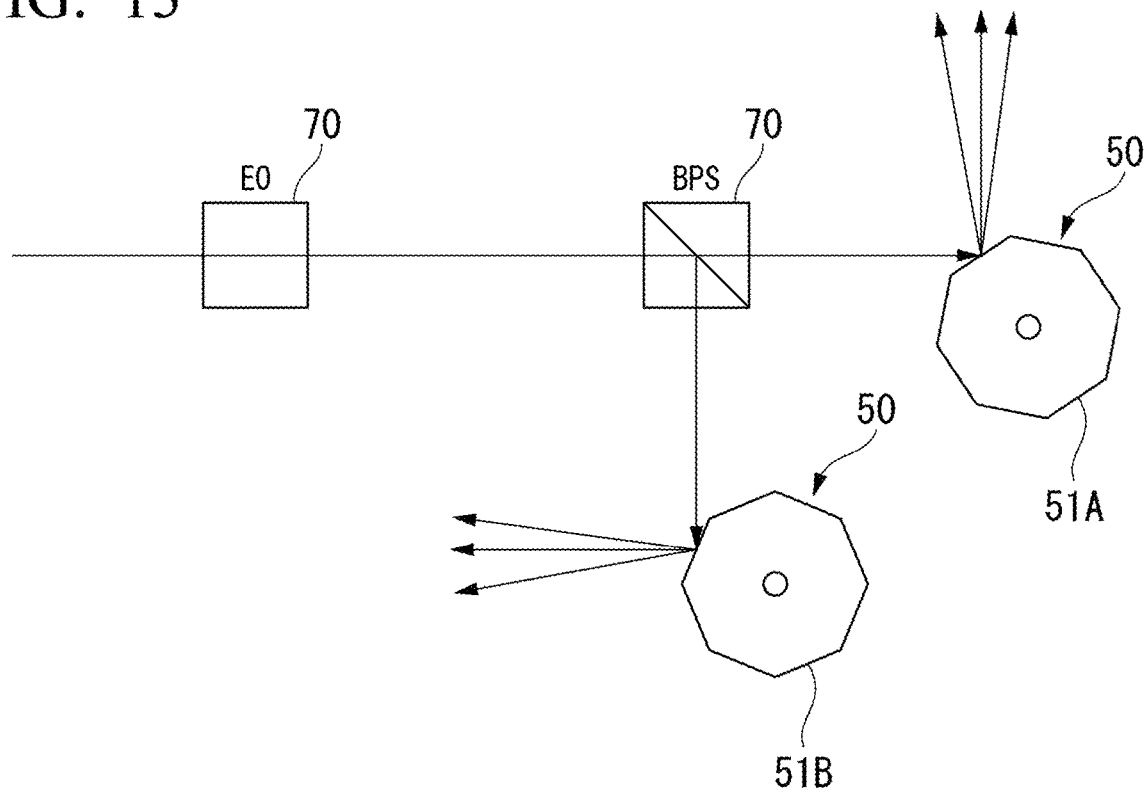
FIG. 13 is a view showing an example in which an electro-optical modulator is applied as a subsidiary divider (dynamic time divider) and a polarization beam splitter is applied as a subsidiary divider (static divider).

In a specific embodiment, the electro-optical modulator (EOM, EO) is applied as the subsidiary divider (dynamic time divider) 70, the polarization beam splitter (PBS) is applied as the subsidiary divider (static divider) 70, and the plurality of polygon mirror devices are applied as the time divider 50 (FIG. 13). The polygon mirrors 51A and 51B of the plurality of polygon mirror devices are disposed with a positional relation parallel to the optical path. In one example, the EOM 70, the PBS 70 and polygon mirror 50 are sequentially disposed on the optical axis in a direction in which the beam advances. In this type, the beam from the EOM 70 is branched off according to the wavelength bandwidth by the PBS 70. The p-polarization beam passing through the PBS 70 is time-divided by the first polygon mirror 51A, and the s-polarization beam reflected by the PBS 70 is time-divided by the second polygon mirror 51B.

Figure 14:
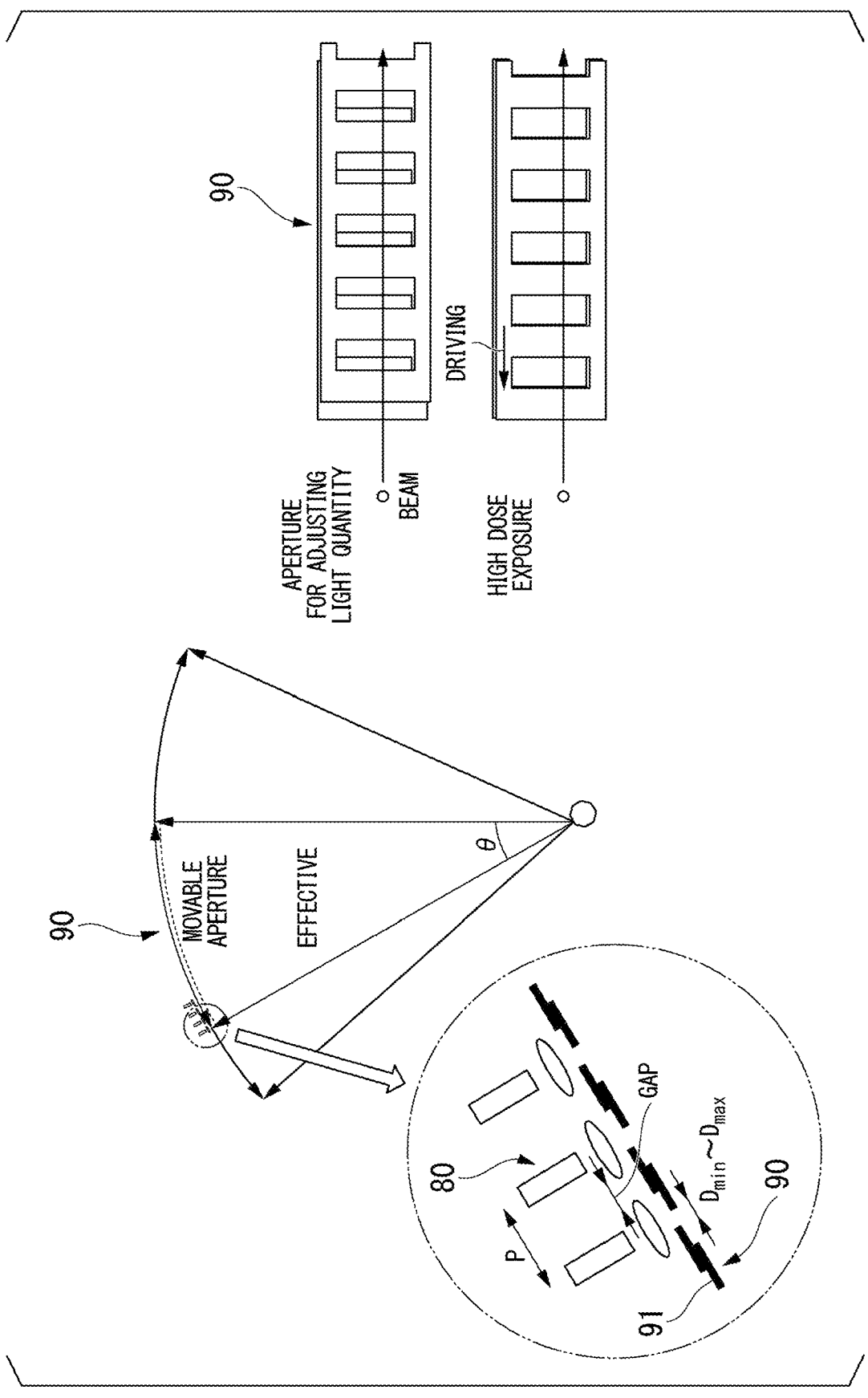
FIG. 14 is a view showing an example including an aperture device disposed on an optical path.

In a specific embodiment, the laser beam system further includes an aperture device 90 optically disposed between the time divider 50 (or the subsidiary divider 70) and the optical fiber 80 (or the output module 30) (FIG. 14). The aperture device 90 has an aperture 91, and an area of an opening through which the beam passes is controlled by the controller 40. The aperture 91 has a plurality of openings. In this type, for example, among the beams from the time divider 50, the beam passing through the first opening of the aperture 91 enters the first fiber as the first time-divided beam, and the beam passing through the second opening enters the second fiber as the second time-divided beam. In addition, a quantity of light of each of the time-divided beams is adjusted by controlling the opening area of the aperture 91. In this type, it is preferably applied to a beam such as a CW laser beam or the like, an emission time of which is relatively long.

In one embodiment, the laser beam system is applied to a photolithography system configured to manufacture a device (an electronic device or a micro device) such as a semiconductor element, a liquid crystal display element, an organic EL element, or the like. In one example, a collective exposure type exposure device such as a stepper or the like, or a scanning exposure type exposure device such as a scanning stepper or the like is used. For example, in the exposure device, a predetermined pattern is formed on each of shot regions of a substrate such as a wafer, a glass plate, or the like, via a projection optical system.

In an example of the exposure device, a pattern formed on a mask (or a reticle) held on a mask stage is transferred to a substrate through irradiation of the exposure light via the projection optical system.

In another example of the exposure device, instead of the mask, a variable pattern is formed on a substance surface of a projection optical system using a spatial light modulator (SLM) (maskless type exposure device).

At least a part of a configuration of various exposure devices, for example, disclosures of US2009/0117494A1, US2010/0099049A1, US2013/0222781 A1, US2013/0278912A1, US2013/0314683A1, US2014/0320835A1, US2015/0077732A1 and U.S. Pat. No. 6,552,775B1 may be incorporated herein by reference.

In a specific embodiment, the laser beam system is applied to the exposure device as a photography system configured to manufacture a flat panel display (a liquid crystal display device, an organic EL display device, or the like).

Figure 15:
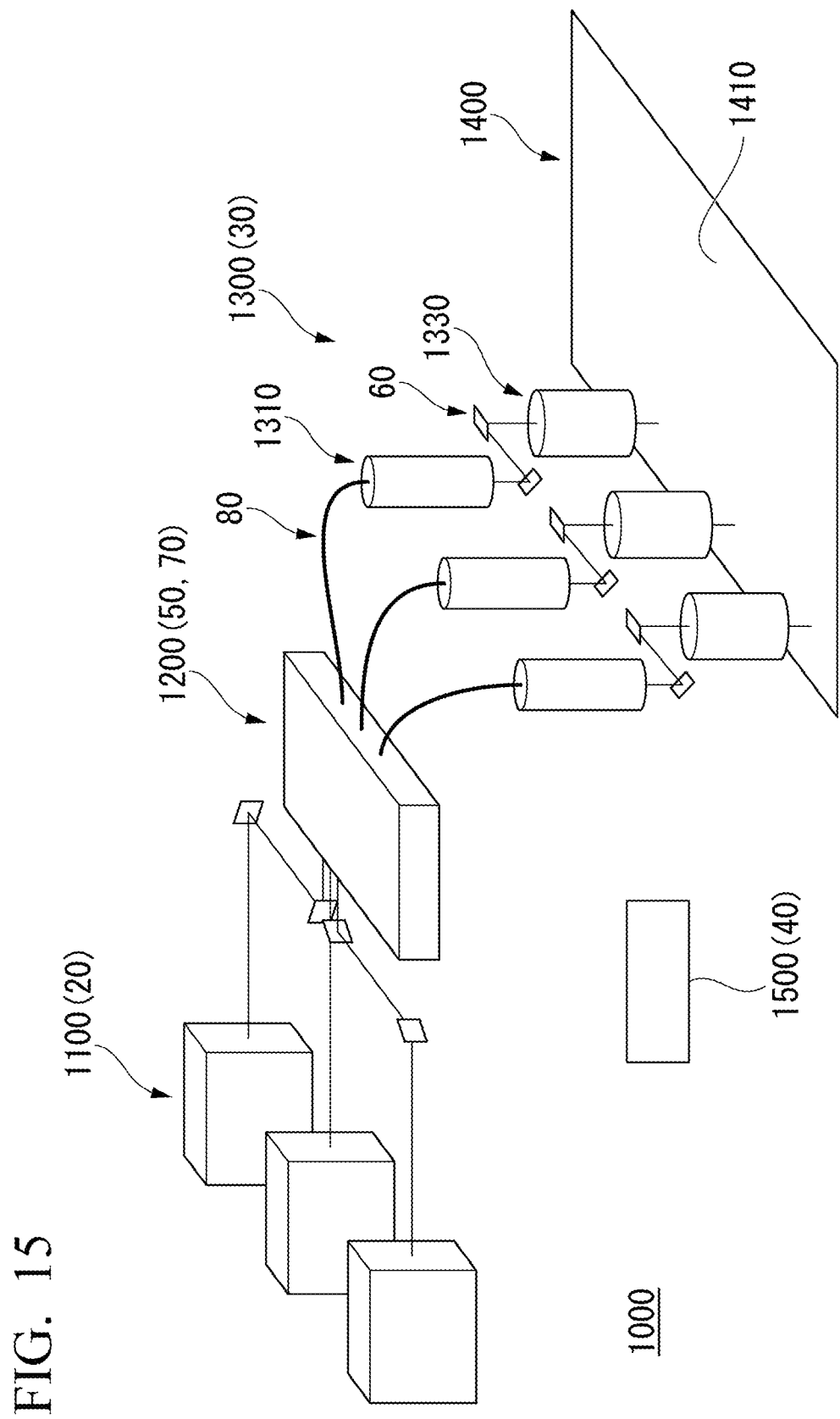
FIG. 15 is a view schematically showing the entire configuration of an exposure device.
Figure 16:
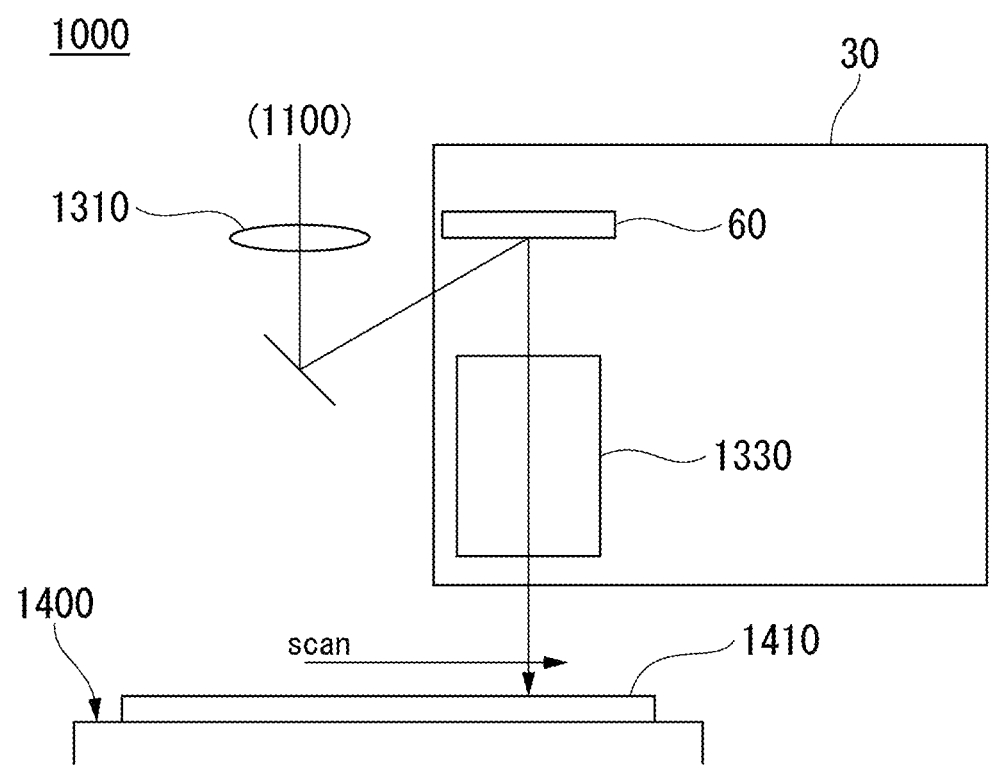
FIG. 16 is a view showing a configuration example of the exposure device.

FIGS. 15 and 16 are views schematically showing a configuration of an embodiment of a maskless type exposure device 1000. The exposure device 1000 includes a light source module 1100 including the laser light source 20, a distribution module (synthesis/distribution module) 1200 including the time divider 50 and the subsidiary divider 70, an illumination system 1300 including an output module (including the optical fiber 80, the illumination optical system (illumination system) 1310, the SLM 60 and the projection optical system (projection lens) 1330) 30, a substrate stage 1400 on which a substrate (workpiece) 1410 is mounted, and a control system 1500 including the controller 40 and the data transmission unit.

In FIG. 15 and FIG. 16, the light source module 1100 radiates laser beams with light energy. The beam from the light source module 1100 enters the illumination system 1310 via the distribution module 1200. The beam from the illumination system 1310 illuminates the SLM 60. The controller 40 generates pattern data on the basis of the exposure pattern formed on the substrate 1410. The controller 40 transmits the pattern data to the SLM 60, and controls the SLM 60. The SLM 60 is controlled by the controller 40, and guides the beam from the illumination system to the substrate 1410 on the basis of the pattern data (simply expressed as image data and image in some cases). The projection lens 1330 projects the beam from the SLM 60 onto the substrate 1410, and images the beam in a predetermined region on the substrate 1410. Further, when the exposure pattern is formed on the substrate 1410 by the plurality of SLMs 60, the controller 40 divides the generated pattern data for each of the SLMs 60, and transmits the divided pattern data to each of the SLMs 60.

Figure 17:
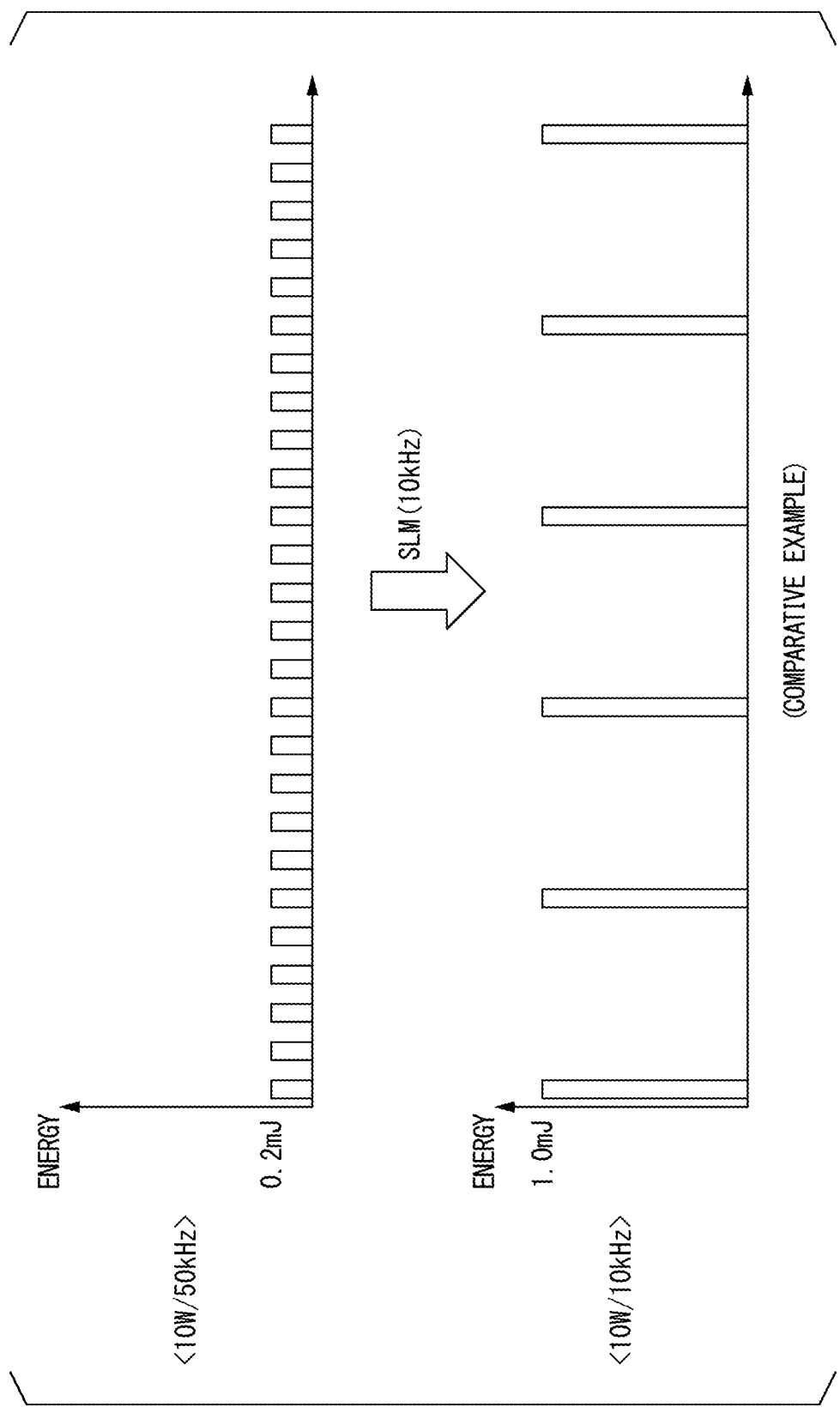
FIG. 17 is a view for describing a relation between a repeating frequency of a laser beam and an operation frequency of an SLM.
Figure 18:
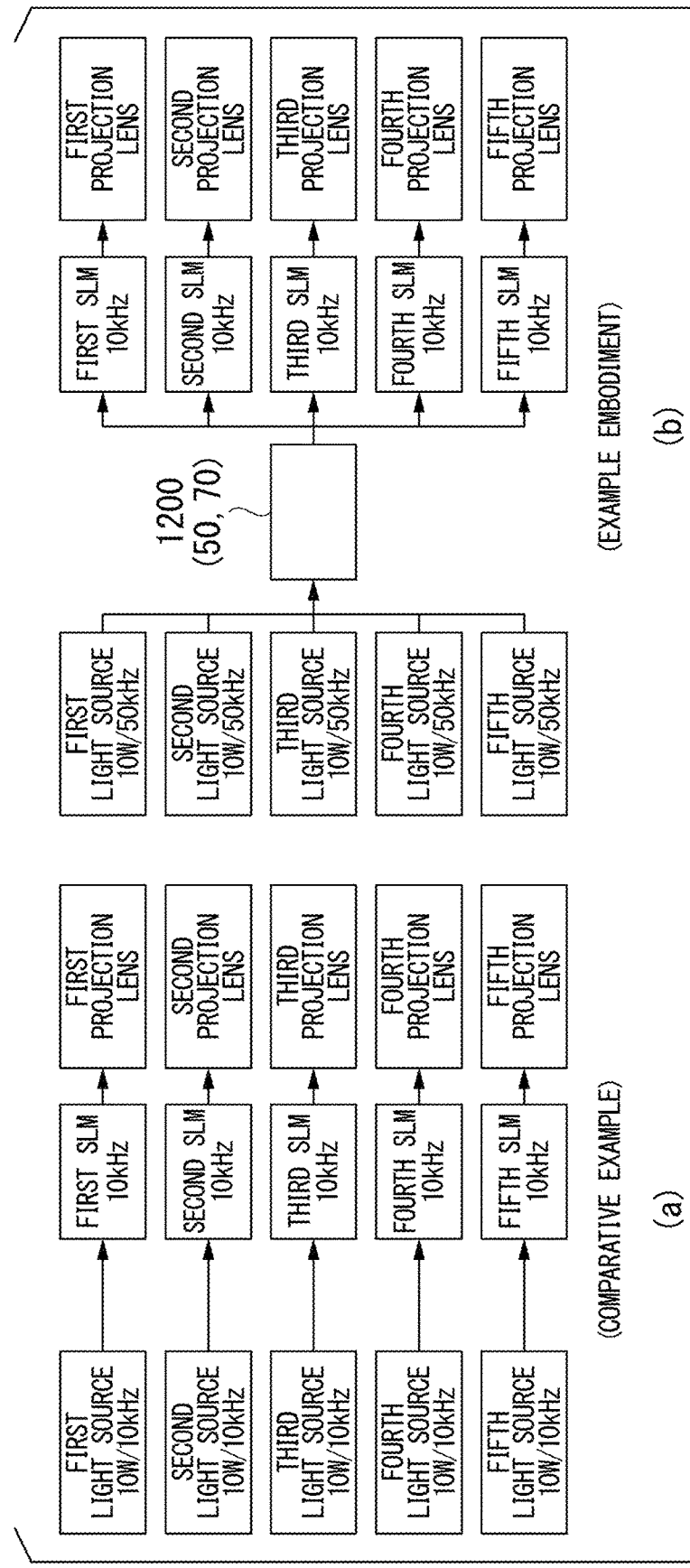
FIG. 18 is a view for describing a combination of a light source and an output module.

In the scan type exposure device using the SLM, the laser beam is emitted during movement of the substrate stage 1400 on which the substrate is placed, and the laser beam is guided to the SLM via the illumination optical system 1310. The image formed on the SLM is preferably exposed with a single emission of the laser beam. When the image formed on the SLM is exposed with emission of the laser beam two times or more, the same pattern data are projected onto the substrate on each emission. Since the substrate 1410 moves also between the emission and the emission of the laser beam by the substrate stage 1400, when the same pattern data are projected onto the substrate, it will be exposed as if the image is flowing. When the scan speed is increased for throughput improvement, a moving distance between the emission and the emission of the laser beam is lengthened, and the image will flow more. In order to increase a scan speed for throughput improvement and make it difficult for the image to flow, one emission time must be shortened. When one emission time is short, since the energy of the laser beam radiated onto the substrate 1410 via the SLM is lowered, an exposure defect (photosensitive defect) in which exposure energy is insufficient may occur. In general, an operation frequency (for example, an image updating frequency) of the SLM is lower than an emission repeating frequency (an oscillation frequency) of the laser beam, for example, several kHz to tens kHz. In a comparative example of FIG. 17, the laser beam is 50 kHz (10 W), and the SLM is 10 kHz. As shown in the comparative example of FIG. 17 and FIG. 18(*a*), an oscillation frequency having a low frequency in order to prevent the image from flowing and a high energy light source that does not generate an exposure defect are desired, but in consideration of the wavelength condition as well, the choice of the laser light source is extremely limited at present. The numerical value is an example, and the present invention is not limited thereto.

In the embodiment, as described using FIG. 3 and FIG. 4 first, a low frequency and high energy beam output is realized by a combination of synthesis and time division of the plurality of beams. In the example in FIG. 18(*b*), the distribution module 1200 synthesizes and time-divides the beams from five light sources 20. The beams emitted from the five light sources with a frequency of 50 kHz are synthesized and become a high energy beam. The synthesized beam (50 kHz, high energy) is time-divided and guided to the five SLMs 60 (and the five projection lenses 1330) by the distribution module 1200. For this reason, a high energy beam with a frequency of 10 kHz arrives at each of the first to fifth SLMs. Further, in both of the comparative example of FIG. 18(*a*) and the example of FIG. 18(*b*), the light sources with a total 50 W are used in five modules. Further, in the comparative example of FIG. 17, since the laser beam is 50 kHz (10 W) and the SLM is 10 kHz, the light is distributed (parted, switched) to the five SLMs by the distribution module 1200. The oscillation frequency of the laser beam is preferably an integral multiple of the image updating frequency of the SLM. In other words, the distribution module 1200 distributes the laser beam into the number of SLMs, which is the integral multiple. The numerical value is an example, and the present invention is not limited thereto.

In the example, the intensity (for example, pulse energy, average power) E2 of the laser beam radiated to the one SLM is equal to or greater than the intensity (for example, pulse energy, average power) E1 of the laser beam emitted from the one laser light source. For example, E2/E1 may be about 1, 2, 3, 4, 5, 6, 7, 8, 9, 10, 11, 12, 13, 14, 15, 16, 17, 18, 19, 20, 25, 30, 35, 40, 45, 50, 100 or more. In addition, a frequency (an irradiation frequency) F2 of the beam radiated to the one SLM or an image updating frequency F3 of the SLM is lower than an emission repeating frequency (an oscillation frequency, a light source frequency) F1 of the laser light source. For example, F2/F1 (or F3/F1) may be about ½, ⅓, ¼, ⅕, ⅙, 1/7, ⅛, ⅑, 1/10, 1/11, 1/12, 1/13, 1/14, 1/15, 1/16, 1/17, 1/18, 1/19, 1/20, 1/25, 1/30, 1/35, 1/40, 1/45. 1/50, 1/100 or less.

Figure 19:
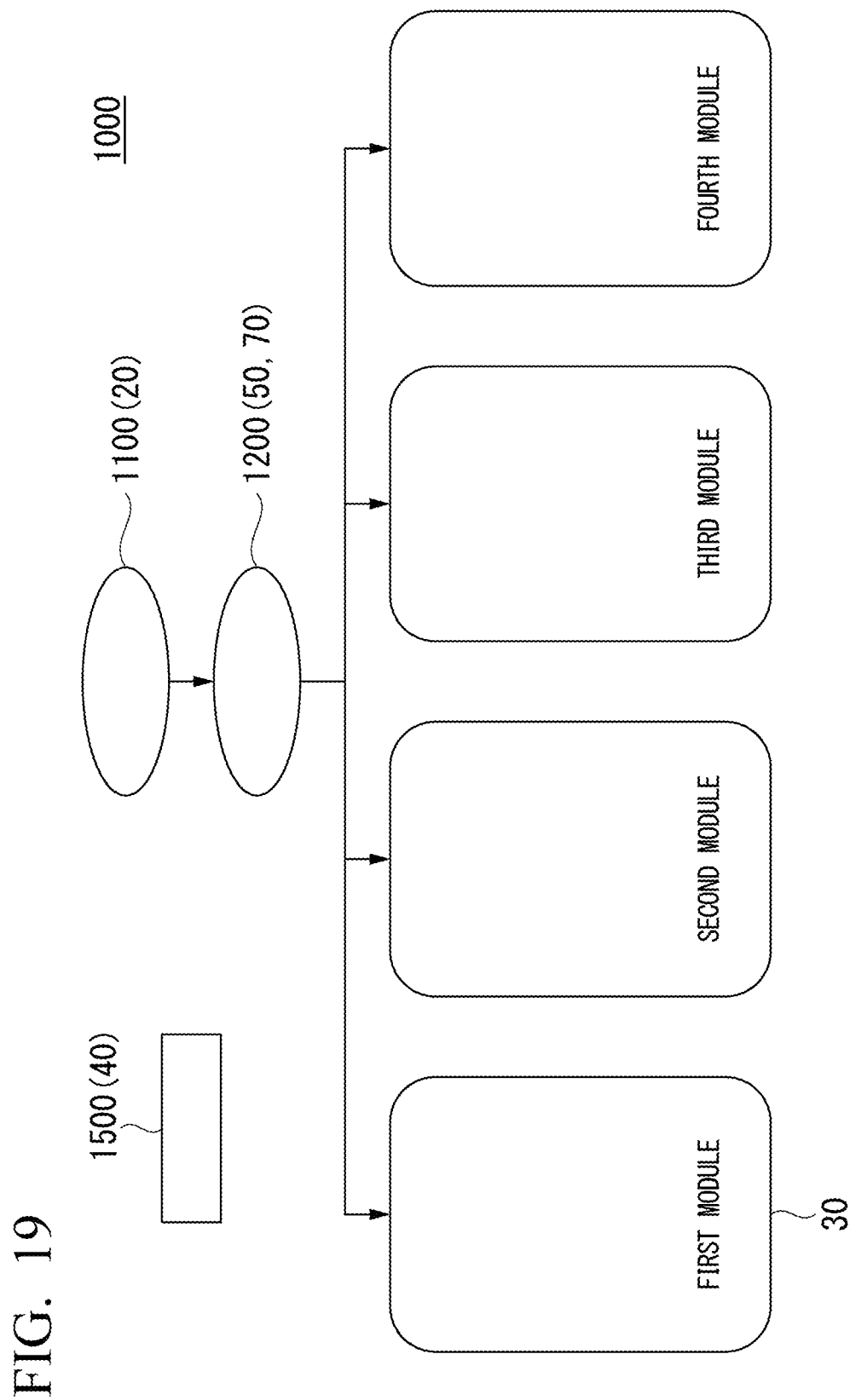
FIG. 19 is a view showing an example of a configuration of the exposure device that does not include the SLM.

Alternatively, as shown in FIG. 19, the combination of the synthesis and the time division of the plurality of beams is also applicable to a system (for example, an exposure device) that does not include the SLM. In the example of FIG. 19 (the exposure device 1000), a plurality of time-divided beams (a plurality of distributed beams) are generated for each predetermined span on a time axis. Beams with a relatively low frequency and high energy are supplied to each of the plurality of modules 30.

Figure 20:
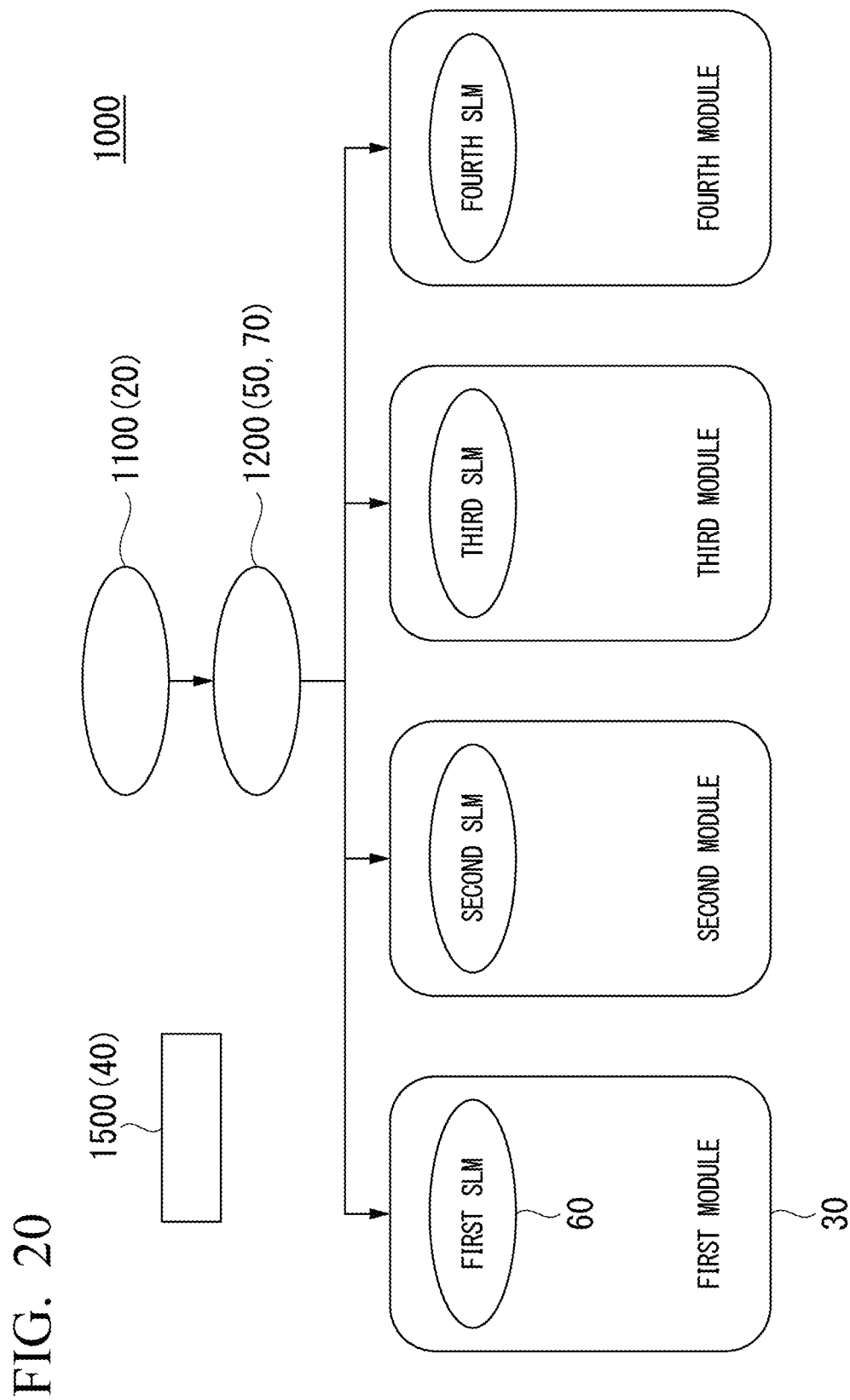
FIG. 20 is a view showing an example of a configuration of the exposure device including the SLM.

The number of the output modules 30 (a distribution number) can be arbitrarily set as described above. In the example of FIG. 20, the distribution module 1200 synthesizes and time-divides the beams from the four light sources 20. The time-divided beams are supplied to each of the four SLMs 60 (the modules 30).

Figure 21:
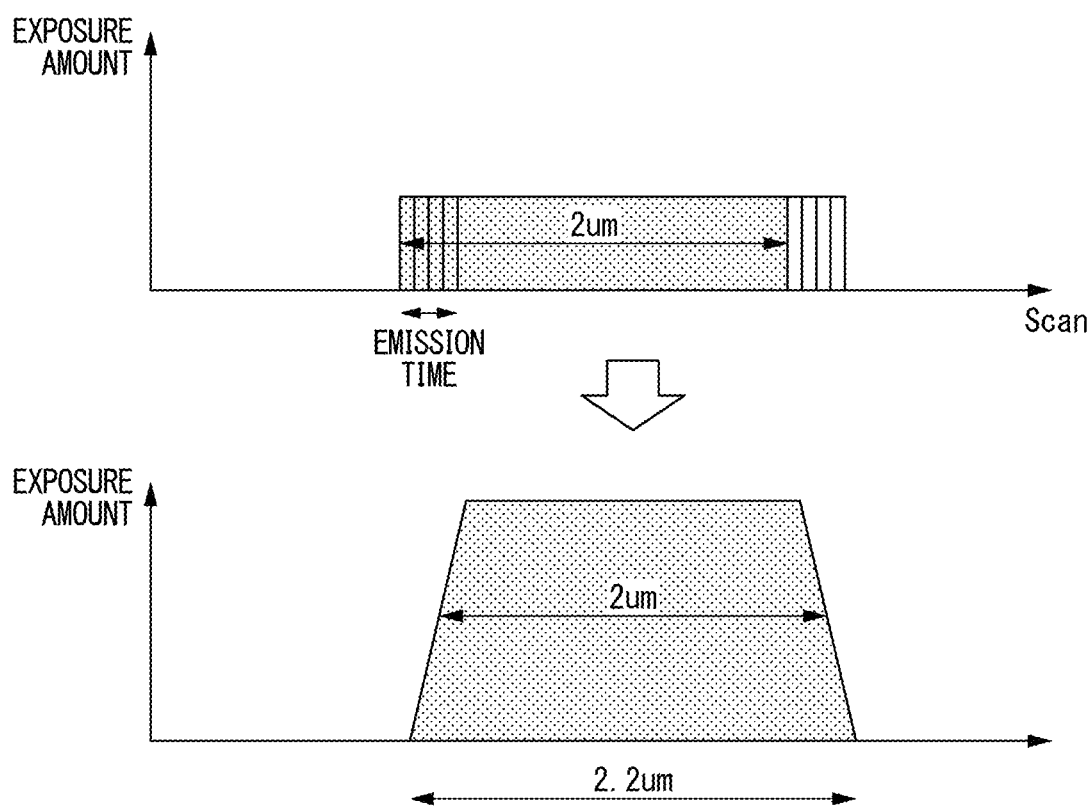
FIG. 21 is a view for describing a relation between a pattern line width and an emission time.

In the example of FIG. 21, a line width of a pattern is 2 μm, and a scan speed is 400 mm/s. For example, when 10% of the line width of the pattern is allowed, and a necessary emission time is within 0.5 μs. The numerical value is an example, and the present invention is not limited thereto.

Figure 22:
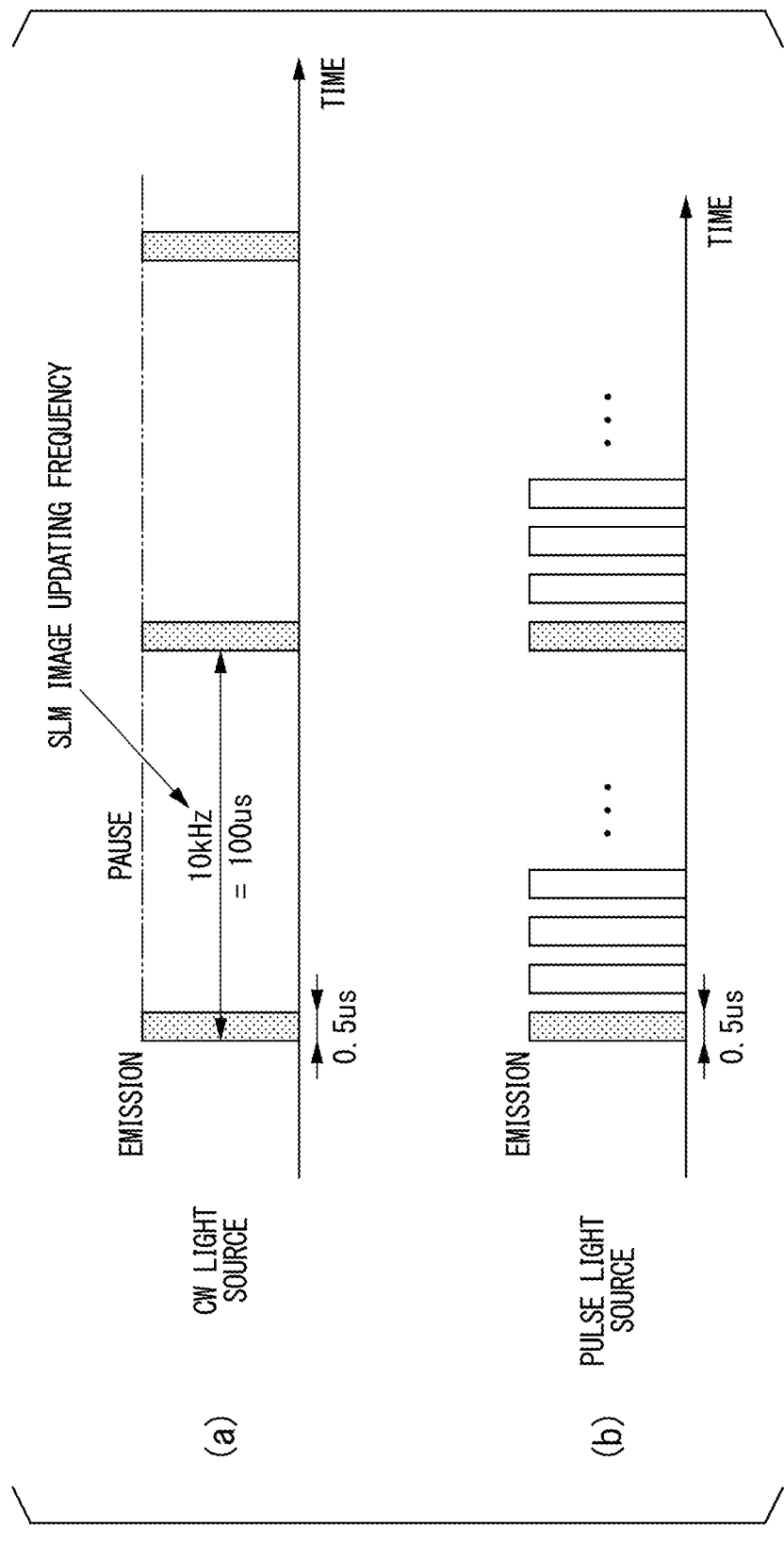
FIG. 22 is a view for describing energy loss of a beam.

In the comparative example of FIG. 22(*a*), the operation frequency (the image updating frequency) of the SLM is 10 kHz. In the same specification as the example of FIG. 21, 10 kHz corresponds to 100 μs. In the CW light source, when the necessary emission time is 0.5 μs, if the beam is radiated to the SLM after 0.5 μs, since the image on the SLM is not updated, the same projection image is formed on the substrate 1410 that is moving as if the image will flows as described above. In order to prevent the image from flowing, during the time from 0.5 μs until the next image on the SLM is updated, for example, the beam is blocked in the middle of the optical path from CW light source to the SLM such that the beam is not radiated to the SLM. In this case, the time from 0.5 μs until the next image on the SLM is updated is substantially a pause time. In the comparative example, only ¹⁄₂₀₀ of the energy from the light source will expose the substrate 1410.

Similarly, in the comparative example of FIG. 22(*b*), the operation frequency (image updating frequency) of the SLM is 10 kHz. In the beams from the pulse light source, only the beam at the timing when the SLM and the pulse light source are synchronized can be used. In the comparative example, when the frequency of the light source is 400 kHz, operation frequency/light source frequency of SLM=¹⁄₄₀, and only ¹⁄₄₀ of the energy from the light source is used. That is, in 40 pulses oscillated from the pulse light source, only one pulse radiates the SLM, in other words, 39 pulses do not radiate the SLM, and the 39 pulses do not contribute to the exposure of the substrate 1410. For this reason, in the comparative example of FIGS. 22(*a*) and 22(*b*), an exposure defect (photosensitive defect) in which exposure energy is insufficient may occur. The numerical value is an example, and the present invention is not limited thereto.

Figure 23:
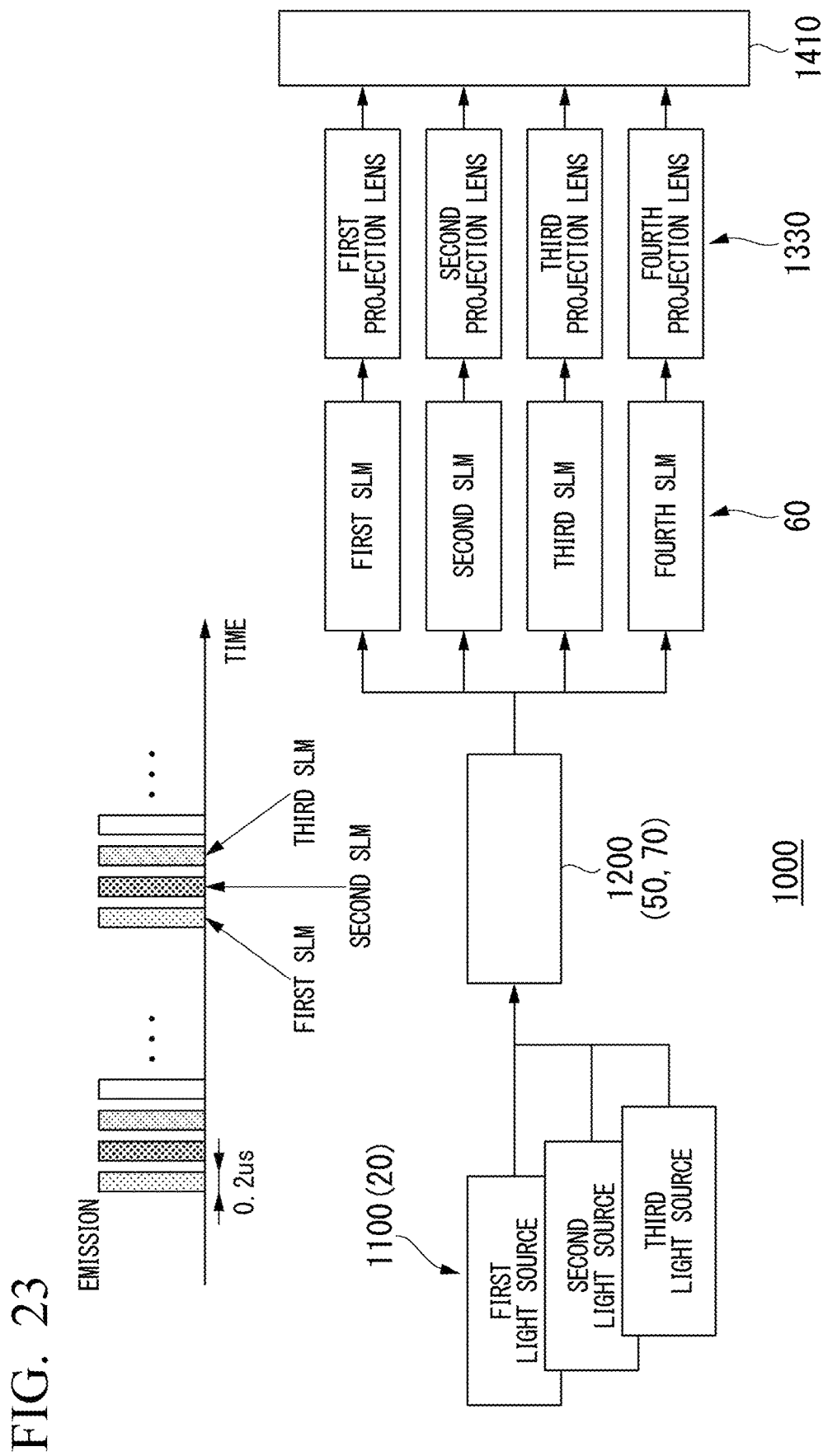
FIG. 23 is a view for describing time division of a beam.

In the example of FIG. 23, the time-divided beams from the distribution module 1200 are guided to each of the plurality of SLMs 60 (the projection lens 1330), which includes the first, second and third SLMs, in a non-scan direction (a non-scanning direction, a Y direction) crossing a scan direction (a scanning direction, an X direction) in which the substrate 1410 is moved during exposure. The first, second and third SLMs are arranged and disposed in the non-scanning direction crossing the scanning direction in which the substrate 1410 is moved during exposure. Timing when the second SLM is irradiated with the beam is different from the timing when the first SLM is irradiated with the beam. Similarly, irradiation timing of the third SLM is different from irradiation timing of the first and second SLMs. For example, in the plurality of SLMs 60, the irradiation timing is sequentially shifted in time. Accordingly, the substrate 1410 can be exposed to the energy from the light source that does not contribute to the exposure shown in the comparative example of FIGS. 22(*a*) and 22(*b*) by parting the beams to the different SLMs.

Figure 24:
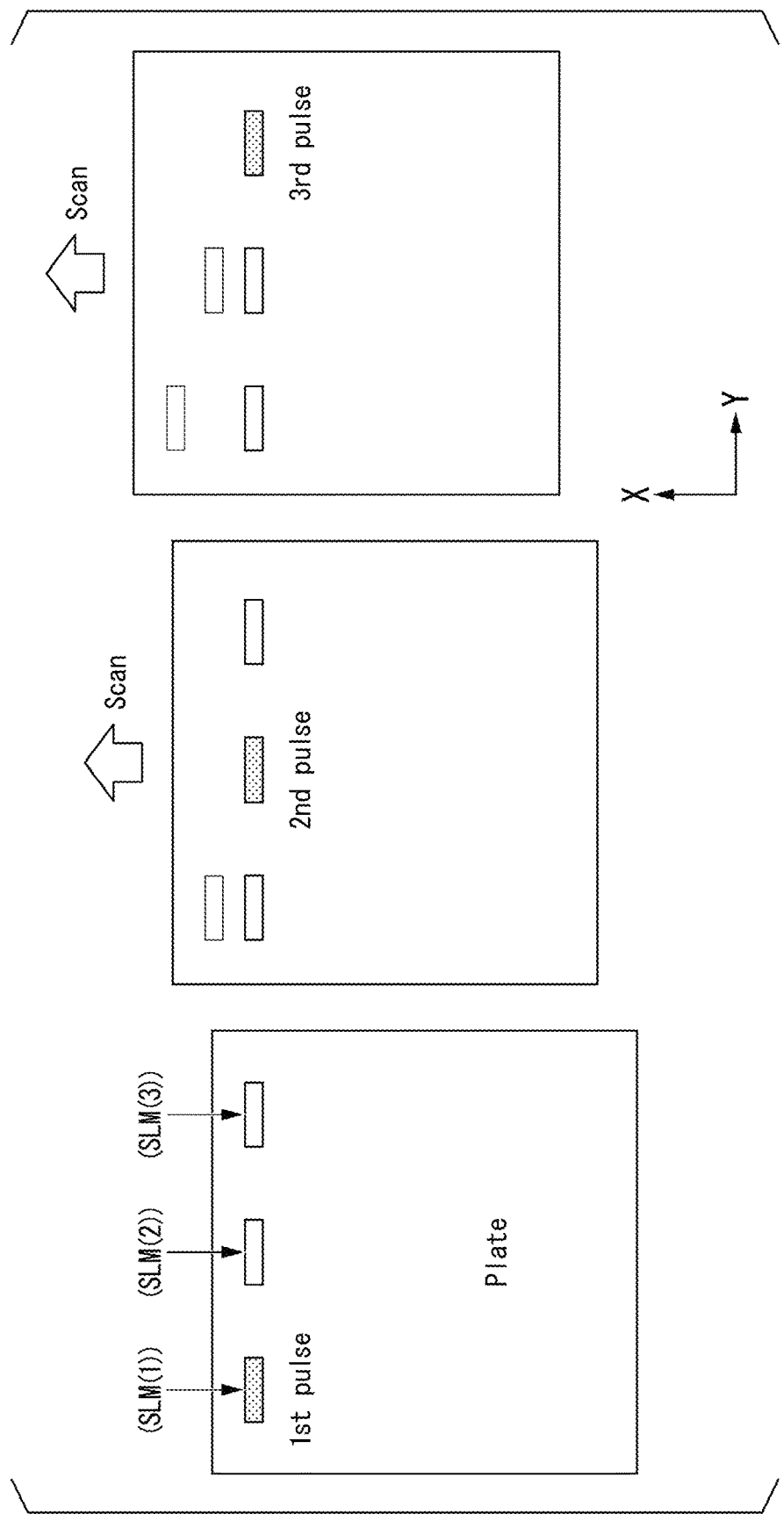
FIG. 24 is a view for describing a deviation of a projection position between a plurality of SLMs on the basis of an irradiation timing.

As shown in FIG. 24, in the exposure device, when the irradiation timing differs between the plurality of SLMs, there is a possibilty that the images on the SLMs are updated at the same timing, and a projection position (exposure position) of a pattern may be deviated according to a difference in timing of the beam irradiation. For example, in comparison with the first pulse corresponding to the first SLM (SLM (1)), a projection position of the second pulse corresponding to the second SLM (SLM (2)) is shifted in the scan direction. In addition, in comparison with the second pulse corresponding to the second SLM (SLM (2)), a projection position of the third pulse corresponding to the third SLM (SLM (3)) is further shifted in the scan direction.

Figure 25:
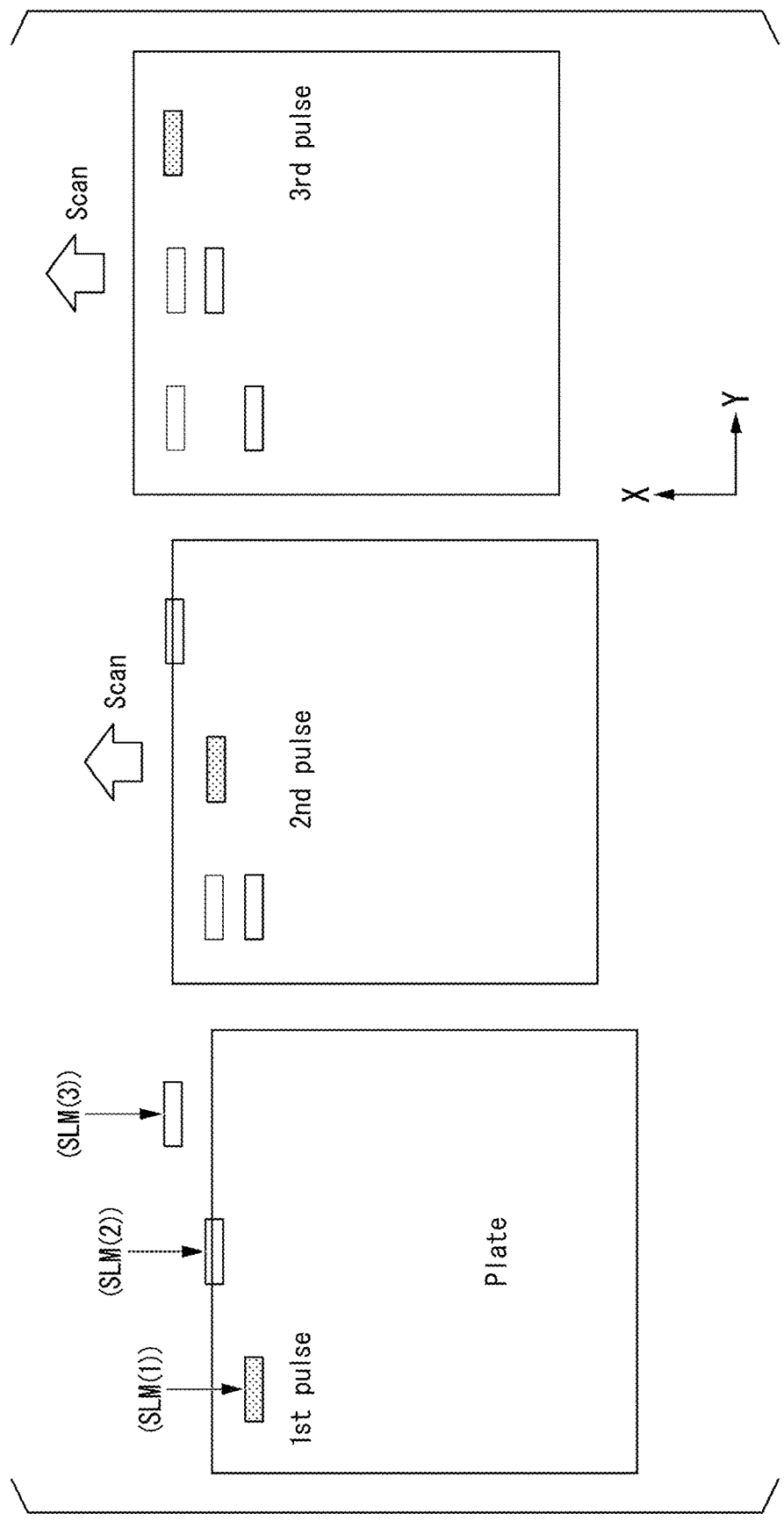
FIG. 25 is a view for describing mechanical and/or optical shift adjustment.

As shown in FIG. 25, even when the irradiation timing differs between the plurality of SLMs by mechanically and/or optically adjusting the exposure device, the deviation of the projection position (exposure position) of the pattern is compensated. In the example, shapes, attachment positions, and/or postures of the plurality of SLMs are mechanically set such that the projection images from the plurality of SLMs have a predetermined positional relation on the basis of the deviation of the irradiation timing with respect to the plurality of SLMs. Alternatively and/or additionally, the exposure device is optically set such that the projection images from the plurality of SLMs have a predetermined positional relation on the basis of the deviation of the irradiation timing with respect to the plurality of SLMs. For example, a position of the projection image on the substrate 1410 is moved by adjusting the optical element in the projection optical system (the projection lens) 1330, or a position of the projection image on the substrate 1410 is moved by moving the SLM with respect to the beam.

As shown in FIG. 26, even when the irradiation timing differs between the plurality of SLMs by adjusting drawing data of the patterns supplied to the plurality of SLMs, the deviation of the projection position (exposure position) of the pattern is compensated. For example, the data corresponding to the projection positions sequentially shifted in the scan direction are supplied to each of the plurality of SLMs. In the example, on the basis of the deviation of the irradiation timing with respect to the plurality of SLMs, at least some of the pattern data is corrected such that the projection images from the plurality of SLMs have a predetermined positional relation. For example, the pattern data supplied to at least one of the plurality of SLMs includes correction data shifted in the predetermined direction with respect to the reference position set on the basis of a difference in irradiation timing. Alternatively and/or additionally, the pattern data may be provided to determine a shift amount in the predetermined direction with respect to the reference position on the basis of at least one of a moving speed of the substrate stage 1400, a display updating frequency of the SLM, an oscillation frequency of a laser beam, a rotation speed of the polygon mirror device (rotation device) 50 as the time divider, the number of the SLMs 60 (the projection lens 1330), and the like.

Figure 27:
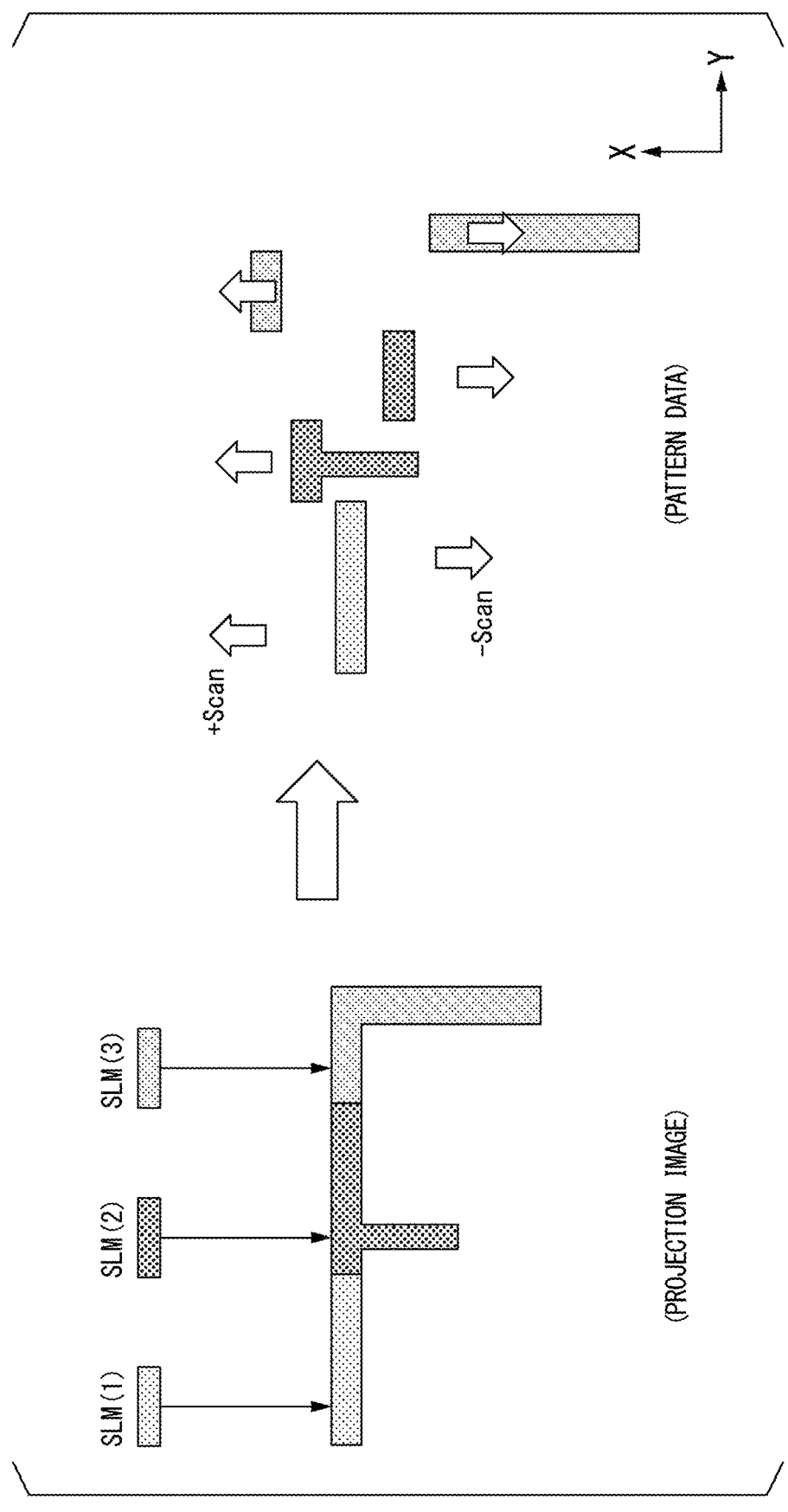
FIG. 27 is a view for describing shift adjustment corresponding to another scan operation.

As shown in FIG. 27, in the exposure device configured to expose one pattern on the substrate 1410 by switching the scan direction (for example, a moving direction of the substrate stage) between a positive direction and a negative direction (between one direction and an opposite direction thereof), the data of the patterns supplied to the plurality of SLMs can be adjusted according to the scan direction at a corresponding timing. For example, the pattern data supplied to at least one of the plurality of SLMs includes first correction data shifted in the positive direction of the scan direction with respect to the reference position, and second correction data shifted in the negative direction of the scan direction with respect to the reference position.

Alternatively and/or additionally, in the exposure device in which the scan direction (for example, the moving direction of the substrate stage) is switched between the positive direction and the negative direction (between one direction and an opposite direction thereof), the exposure device can be mechanically and/or optically adjusted for each switching timing in the scan direction.

Figure 28:
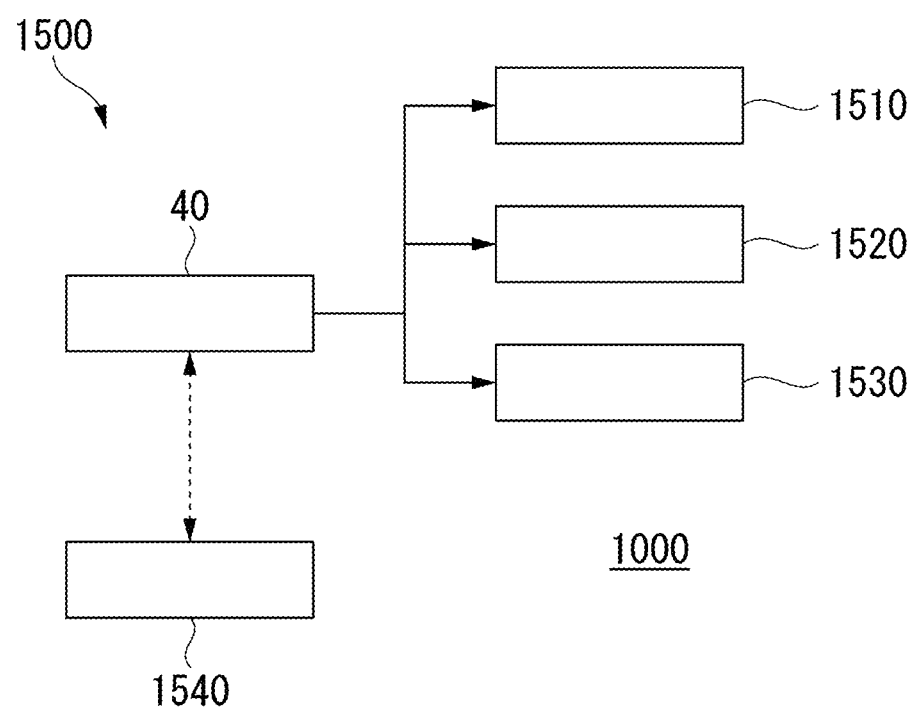
FIG. 28 is a view showing a configuration example of the exposure device related to shift adjustment.

As shown in FIG. 28, the exposure device (the optical device) 1000 may include a driving mechanism 1510 for mechanical adjustment, and a driving mechanism 1520 for optical adjustment. In addition, the exposure device 1000 may include a database 1530 (or a storage unit) in which a set parameter and/or a program for data correction is held. Such shift adjustment can be performed, for example, based on output result of a reference system 1540 including a reference sensor or the like. Further, when the SLM is attached to the exposure device 1000, in the case in which the attachment position is deviated in advance, the driving mechanism 1510 may also be omitted. In addition, even when the attachment position of the SLM is deviated in advance, in order to compensate an attachment error, the driving mechanism 1510 may also be used.

In one example of the exposure device 1000 in which timings when the beams are radiated between the plurality of SLMs are different from each other, the control system 1500 can control at least one of (a-1) mechanical adjustment of the exposure device 1000 using the driving mechanism 1510. (a-2) optical adjustment of the exposure device 1000 using the driving mechanism 1520, and (a-3) correction of the pattern data using the database 1530 based on the irradiation timing of each of the plurality of SLM. For example, shift adjustment in which all of the above-mentioned (a-1), (a-2) and (a-3) are combined is executed. Alternatively, the shift adjustment is executed based on a combination of one or two of the above-mentioned (a-1), (a-2) and (a-3). In the example, correction of the pattern data is applied to relatively large shift adjustment and/or relatively rough shift adjustment, and mechanical and/or optical adjustment is applied to relatively small shift adjustment and/or relatively fine shift adjustment. In another example, another method different from the above-mentioned method can be applied.

Alternatively and/or additionally, the above-mentioned shift adjustment can be executed on the basis of the use timing of the beam. Even when a predetermined period in which the beam is non-used (for example, a non-use pulse) occurs, deviation of the projection position (exposure position) of the pattern is compensated by the above-mentioned shift adjustment. For example, a beam in a relatively unstable period is not used and a stable beam is selectively used while avoiding the deviation of the projection position of the pattern.

Figure 29:
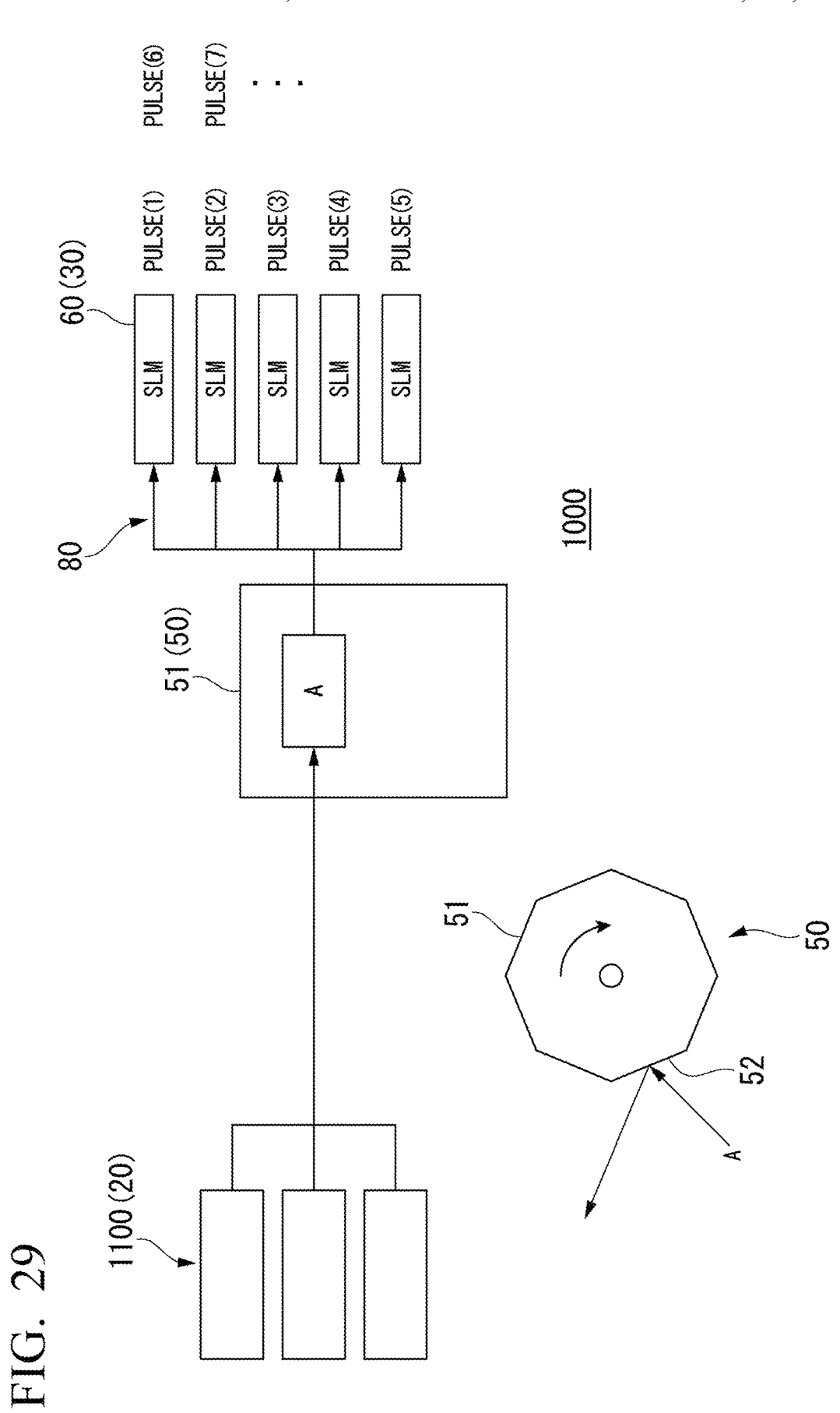
FIG. 29 is a view showing a configuration example of the exposure device.

In the embodiment, as shown in FIG. 29, the exposure device 1000 includes the plurality of laser light sources 20, the plurality of output modules 30 having the plurality of SLMs 60, and the polygon mirror device (rotation device) 50 as a time divider that is disposed between the plurality of laser light sources 20 and the output modules 30 and that is configured to divide the laser beams emitted from the plurality of laser light sources 20 and synthesized in time. The beams from the laser light sources 20 are reflected by each of the plurality of reflecting surfaces 52 of the polygon mirror 51 in the polygon mirror device 50. The beams are divided in time according to the rotation angle of the polygon mirror 51. The beams reflected by the polygon mirror 51 are parted to the plurality of SLMs 60 via the plurality of optical fibers 80 according to the rotation angle of the polygon mirror 51. In the example, the time-divided beams from the polygon mirror 51 are parted to the five SLMs 60. For example, the beams corresponding to a first pulse, a sixth pulse . . . enter the first SLM. The beams corresponding to a second pulse, a seventh pulse . . . enters the second SLM.

Figure 30:
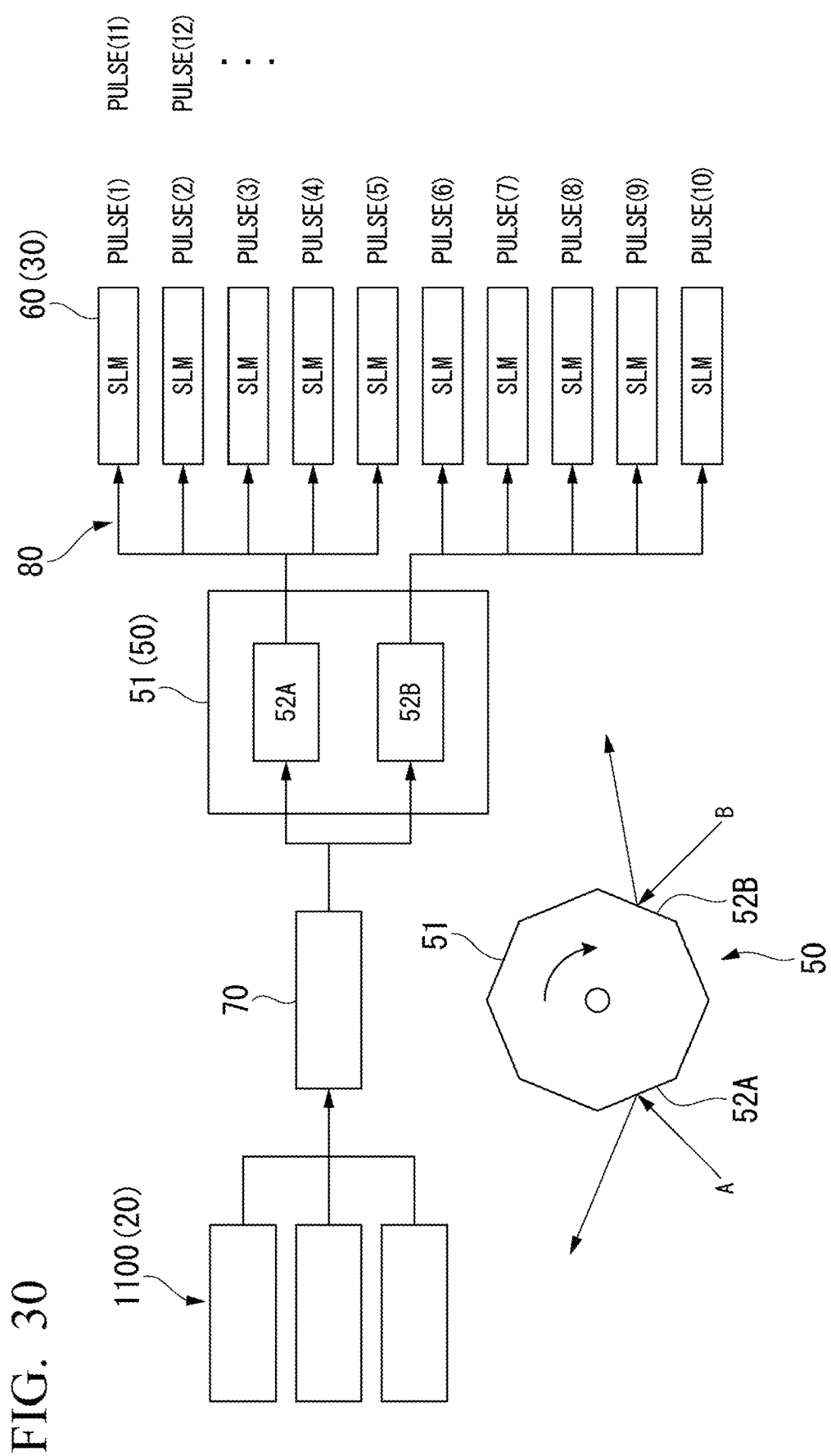
FIG. 30 is a view showing a configuration example of the exposure device.

In the embodiment, as shown in FIG. 30, the exposure device 1000 includes the plurality of laser light sources 20, the plurality of output modules 30 having the plurality of SLMs 60, the polygon mirror device (rotation device) 50 as a time divider that is disposed between the plurality of laser light sources 20 and the plurality of output modules 30 and that is configured to divide the laser beams emitted from the plurality of laser light sources 20 and synthesized in time, and the optical switch device 70 as the subsidiary divider 70 disposed between the plurality of laser light sources 20 and the polygon mirror device 50. In the example, the beam from the optical switch device 70 in the first span on the time axis advances toward the first position of the polygon mirror device 50 via a path "A" and is reflected by the polygon mirror 51 (the reflecting surface 52A). The beam from the optical switch device 70 in the second span on the time axis advances toward the second position of the polygon mirror device 50 via a path "B" and is reflected by the polygon mirror 51 (the reflecting surface 52B). The beams are alternately supplied to the first position and the second position of the polygon mirror 51. The beams are further divided according to the rotation angle of the polygon mirror 51 in time. That is, in the example, two time dividers are disposed in series along the optical path, and the beams are divided in two stages in time. In the example, the time-divided beams from the polygon mirror 51 are parted to the ten SLMs 60. For example, the beams corresponding to a first pulse, an eleventh pulse . . . enter the first SLM. The beams corresponding to a second pulse, a twelfth pulse . . . enter the second SLM. In other words, the beams reflected by the reflecting surface 52A of the polygon mirror 51 are guided to a first SLM group (in FIG. 30, the first SLM to fifth SLM), and the beams reflected by the reflecting surface 52B are guided to a second SLM group (in FIG. 30, a sixth SLM to a tenth SLM).

Figure 31:
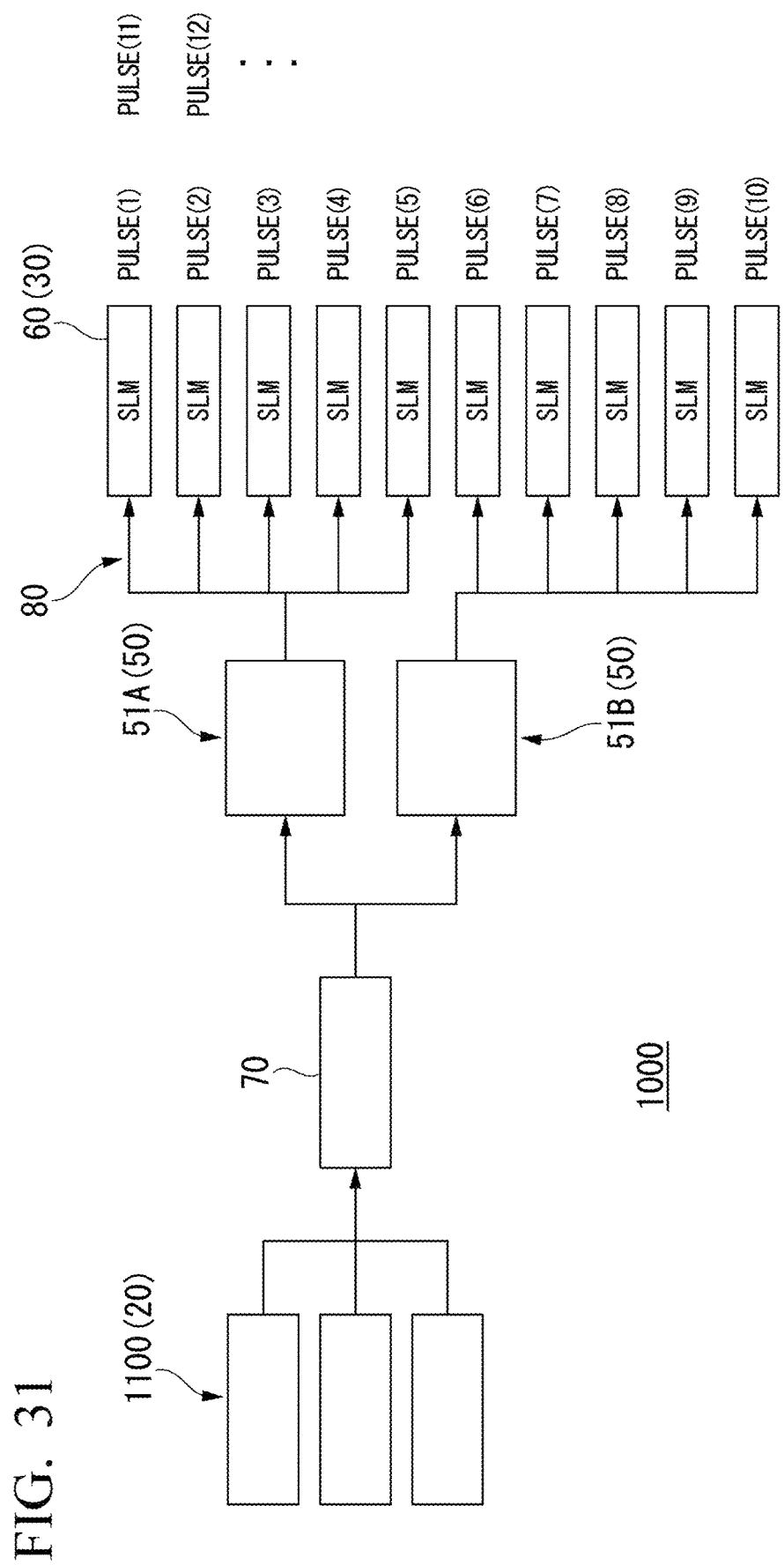
FIG. 31 is a view showing a configuration example of the exposure device.

In the embodiment, as shown in FIG. 31, the exposure device 1000 includes the plurality of laser light sources 20, the plurality of output modules 30 having the plurality of SLMs 60, the plurality of polygon mirror devices (rotation devices) 50 as time dividers that is disposed between the plurality of laser light sources 20 and the plurality of output modules 30 and that is configured to divide the laser beams emitted from the plurality of laser light sources 20 and synthesized in time, and the optical switch device 70 as a subsidiary divider disposed between the plurality of laser light sources 20 and the plurality of polygon mirror devices 50. A plurality of polygon mirrors 51A and 51B of the plurality of polygon mirror devices 50 are disposed to have a positional relation parallel to the optical path. In the example, the beams from the optical switch device 70 in the first span on the time axis advances toward the polygon mirror 51A and are reflected by the reflecting surface of the polygon mirror 51A. The beams from the optical switch device 70 in the second span on the time axis advances toward the polygon mirror 51B and are reflected by the reflecting surface of the polygon mirror 51B. The beams are further divided according to the rotation angles of the polygon mirrors 51A and 51B in time. In the example, the time-divided beams from the polygon mirror 51A are parted to the five SLMs 60. The time-divided beams from the polygon mirror 51B are parted to another five SLMs 60. For example, the beams corresponding to a first pulse, an eleventh pulse . . . enters the first SLM. The beams corresponding to a sixth pulse, a sixteenth pulse . . . enters the sixth SLM. In other words, the beams reflected by the polygon mirror 51A are guided to the first SLM group (in FIG. 31, the first SLM to the fifth SLM), and the beams reflected by the polygon mirror 51B are guided to the second SLM group (in FIG. 30, the sixth SLM to the tenth SLM).

Figure 32:
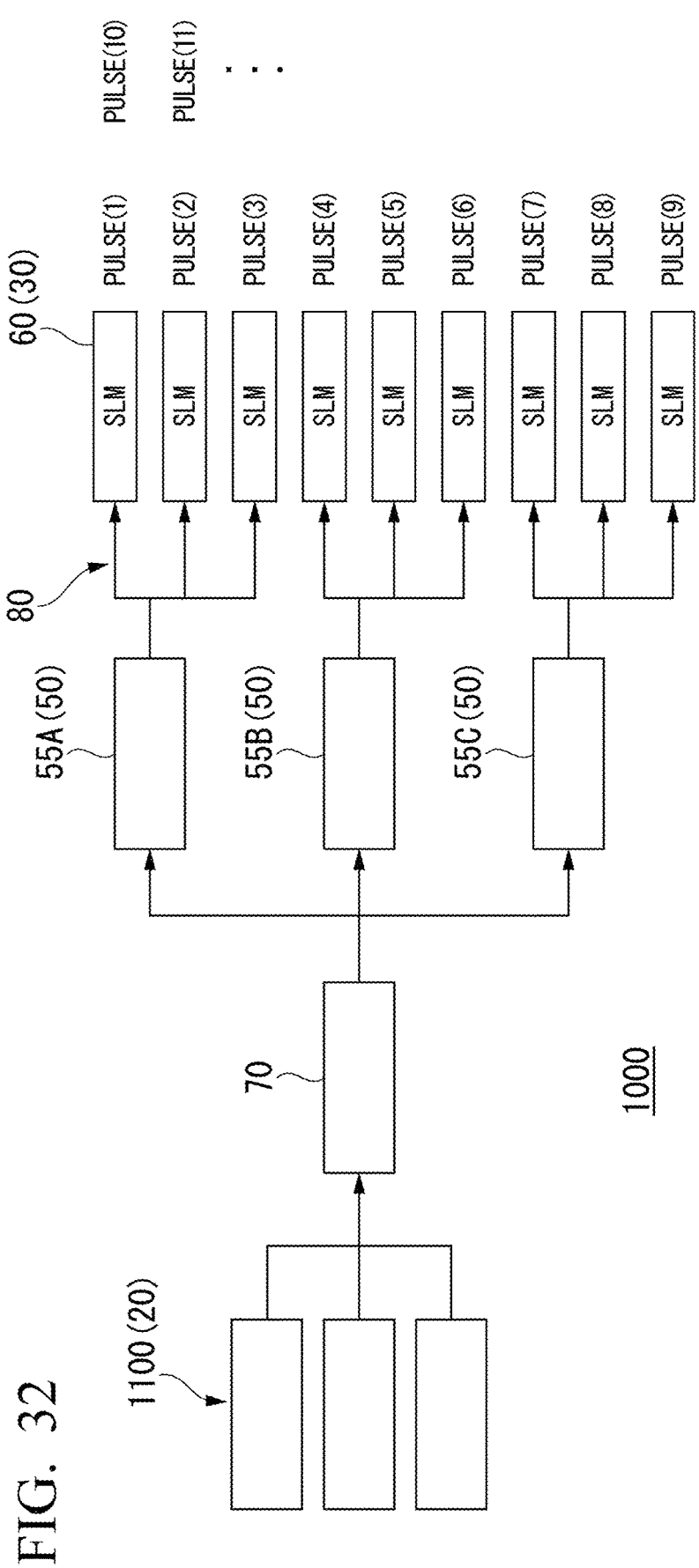
FIG. 32 is a view showing a configuration example of the exposure device.

In the embodiment, as shown in FIG. 32, the exposure device 1000 includes the plurality of laser light sources 20, the plurality of output modules 30 having the plurality of SLMs 60, the plurality of optical switch devices 50 as a time divider that are disposed between the plurality of laser light sources 20 and the plurality of output modules 30 and that are configured to divide the laser beams emitted from the plurality of laser light sources 20 and synthesized in time, and the optical switch device 70 as a subsidiary divider disposed between the plurality of laser light sources 20 and the plurality of optical switch polygon mirror devices 50. A plurality of optical members 55A, 55B and 55C of the plurality of optical switch devices 50 are disposed to have a positional relation parallel to the optical path. In the example, the beams from the optical switch device 70 in the first span on the time axis advances to the optical member 55A and are time-divided by the optical member 55A. The beams from the optical switch device 70 in the second span on the time axis advances to the optical member 55B and are time-divided by the optical member 55B. The beams from the optical switch device 70 in the third span on the time axis advances to the optical member 55C and are time-divided by the optical member 55C. In the example, the time-divided beams from the optical member 55A are parted to the three SLMs 60. The time-divided beams from the optical member 55B are parted to another three SLMs 60. The time-divided beams from the optical member 55C are parted to still another three SLMs 60. For example, the beams corresponding to a first pulse, a tenth pulse . . . enter the first SLM. The beams corresponding to a fourth pulse, a thirteenth pulse . . . enter the fourth SLM. The beams corresponding to a seventh pulse, a sixteenth pulse . . . enter the seventh SLM. In other words, the time-divided beams are guided to the first SLM group (in FIG. 32, the first SLM to the third SLM) by the optical member 55A, the time-divided beams are guided to the second SLM group (in FIG. 32, the fourth SLM to the sixth SLM) by the optical member 55B, and the time-divided beams are guided to the third SLM group (in FIG. 32, the seventh SLM to the ninth SLM) by the optical member 55C.

Figure 33:
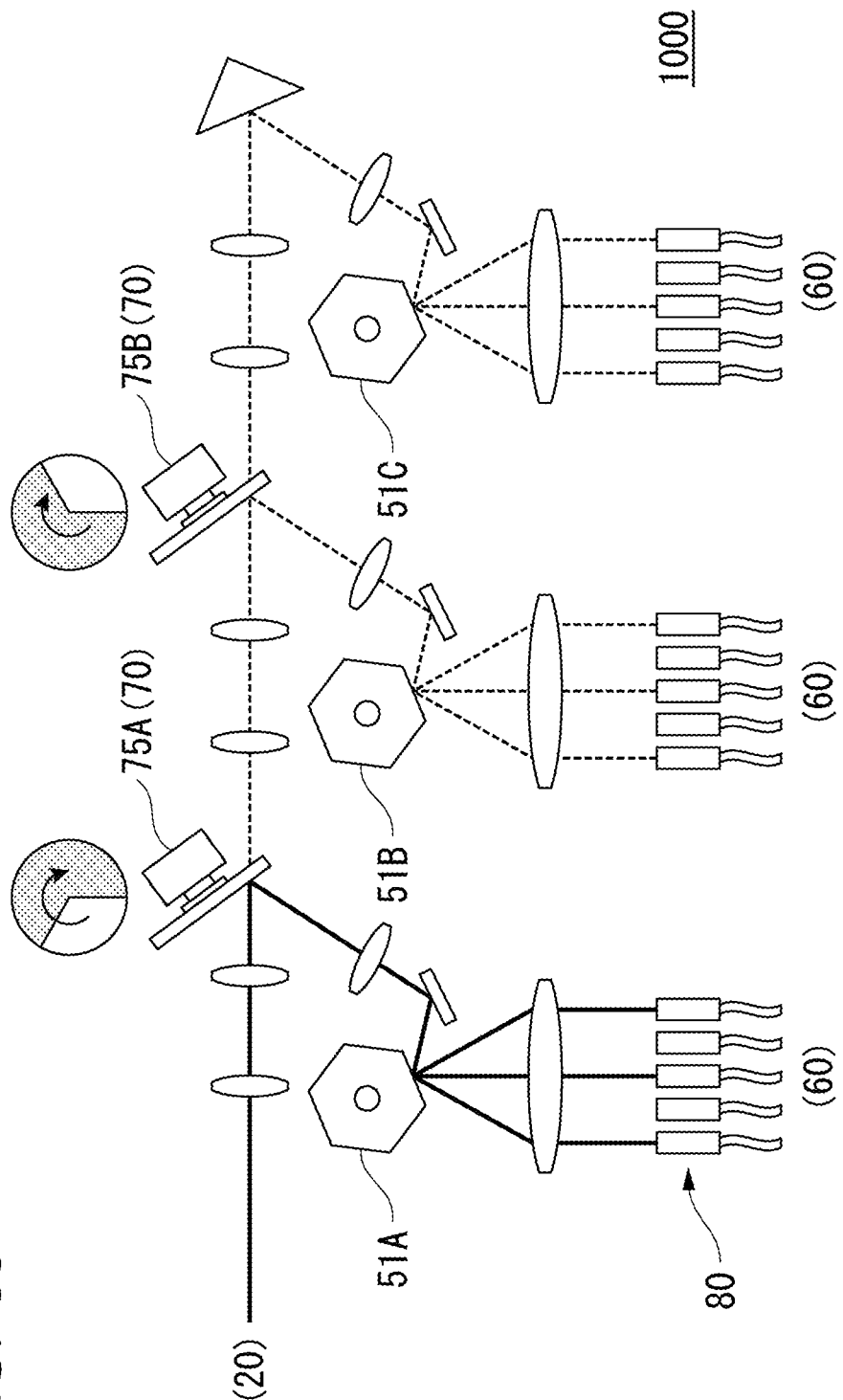
FIG. 33 is a view showing a configuration example of the exposure device.

In the embodiment, as shown in FIG. 33, the exposure device 1000 includes the laser light source 20, the plurality of SLMs 60, the plurality of polygon mirrors 51A, 51B and 51C as a time divider disposed between the laser light source 20 and the plurality of SLMs 60, and a plurality of optical switch devices 70 (optical members 75A and 75B) as a subsidiary divider disposed between the laser light source 20 and the plurality of polygon mirrors 51A, 51B and 51C. For example, the optical members 75A and 75B are rotation plates in which reflecting regions and transmitting regions are arranged side by side in the circumferential direction. In the example, the beams reflected by the optical member 75A in the first span on the time axis advances toward the polygon mirror 51A and are reflected by the reflecting surface of the polygon mirror 51. The beams passing through the optical member 75A and reflected by the optical member 75B in the second span on the time axis advances toward the polygon mirror 51B and are reflected by the reflecting surface of the polygon mirror 51B. The beams passing through the optical member 75B in the third span on the time axis advances toward the polygon mirror 51C and are reflected by the reflecting surface of the polygon mirror 51C. The beams are further divided according to the rotation angles of the polygon mirrors 51A, 51B and 51C in time. A slight change of the incidence angle of the beam based on the rotations of the polygon mirrors 51A to 51C is advantageous for suppression of a speckle.

Figure 34:
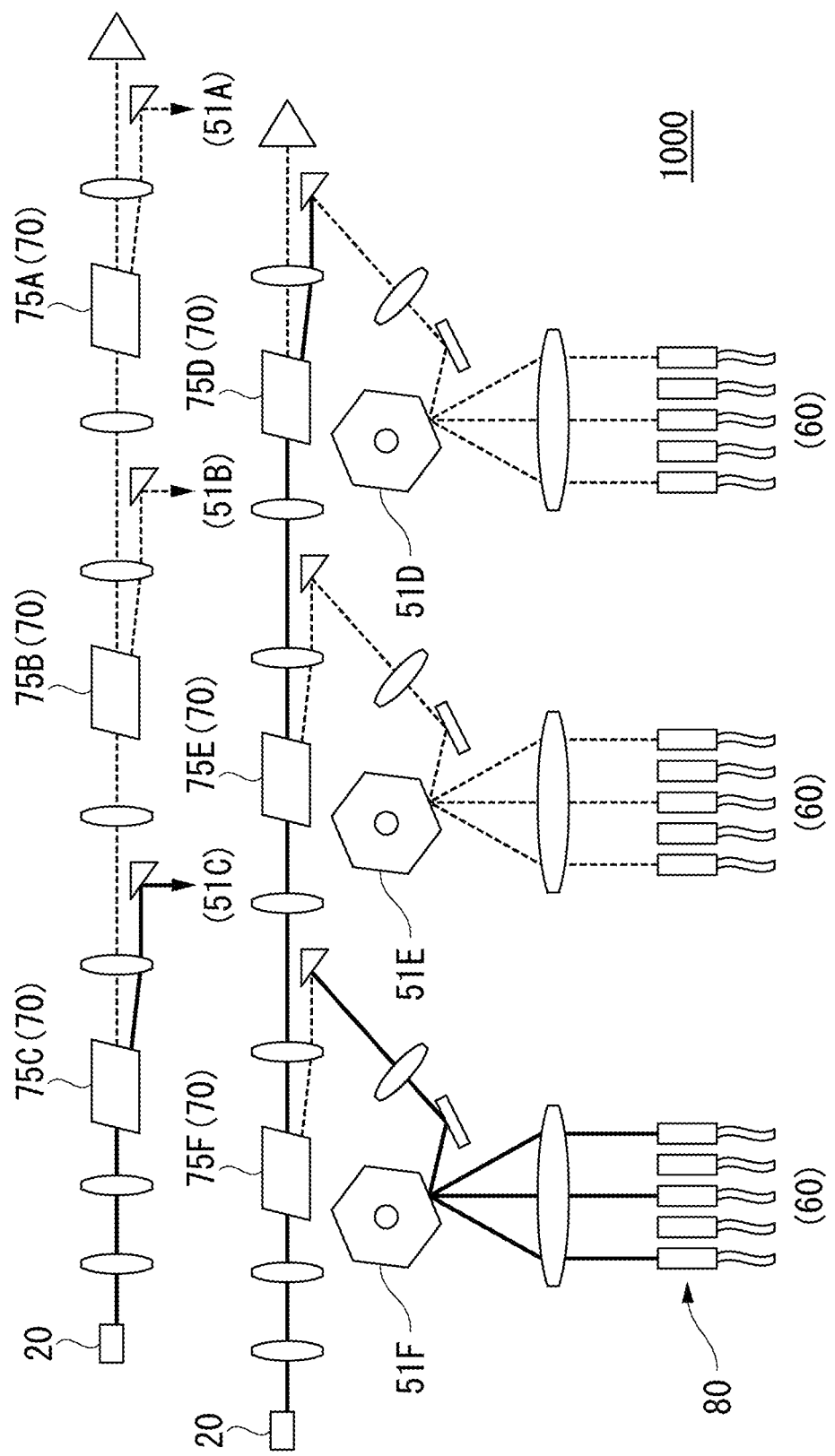
FIG. 34 is a view showing a configuration example of the exposure device.

In the embodiment, as shown in FIG. 34, the exposure device 1000 includes the plurality of laser light sources 20, the plurality of SLMs 60, the plurality of polygon mirrors 51A, 51B, 51C, 51D, 51E and 51F as a time divider that are disposed between the plurality of laser light sources 20 and the plurality of SLMs 60, and the plurality of optical switch devices 70 (the optical members 75A, 75B, 75C, 75D, 75E and 75F) as a subsidiary divider disposed between the plurality of laser light sources 20 and the plurality of polygon mirrors 51A to 51F. For example, each of the optical members 75A to 75F is an acousto-optic modulator (AOM). In the example, the beams branched off by the optical member 75C in the first span on the time axis are directed toward the polygon mirror 51C, and the beams branched off by the optical member 75F are directed toward the polygon mirror 51F. The beams branched off by the optical member 75B in the second span on the time axis are directed toward the polygon mirror 51B, and the beams branched off by the optical member 75E are directed toward the polygon mirror 51E. The beams branched off by the optical member 75A in the third span on the time axis are directed toward the polygon mirror 51A, and the beams branched off by the optical member 75D are directed toward the polygon mirror 51D. The beams are further divided according to the rotation angles of the polygon mirrors 51A to 51F in time. A slight change of the incidence angle of the beam based on the rotations of the polygon mirrors 51A to 51F is advantageous for suppression of a speckle.

Figure 35:
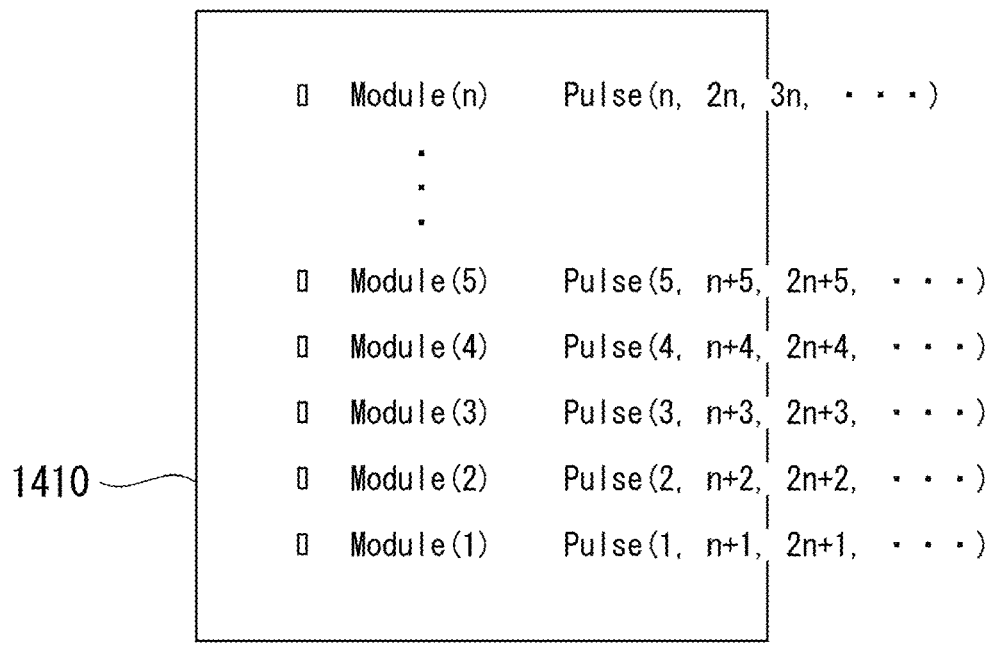
FIG. 35 is a view showing an example of a pattern exposure.

In the example shown in FIG. 35, the substrate 1410 is sequentially exposed by the beams from the plurality of output modules according to the timing of the pulse emission. That is, a plurality of patterns are sequentially projected according to the timing of the pulse emission on the substrate 1410 based on the beams from the plurality of output modules (1, 2, 3, . . . n).

Figure 36:
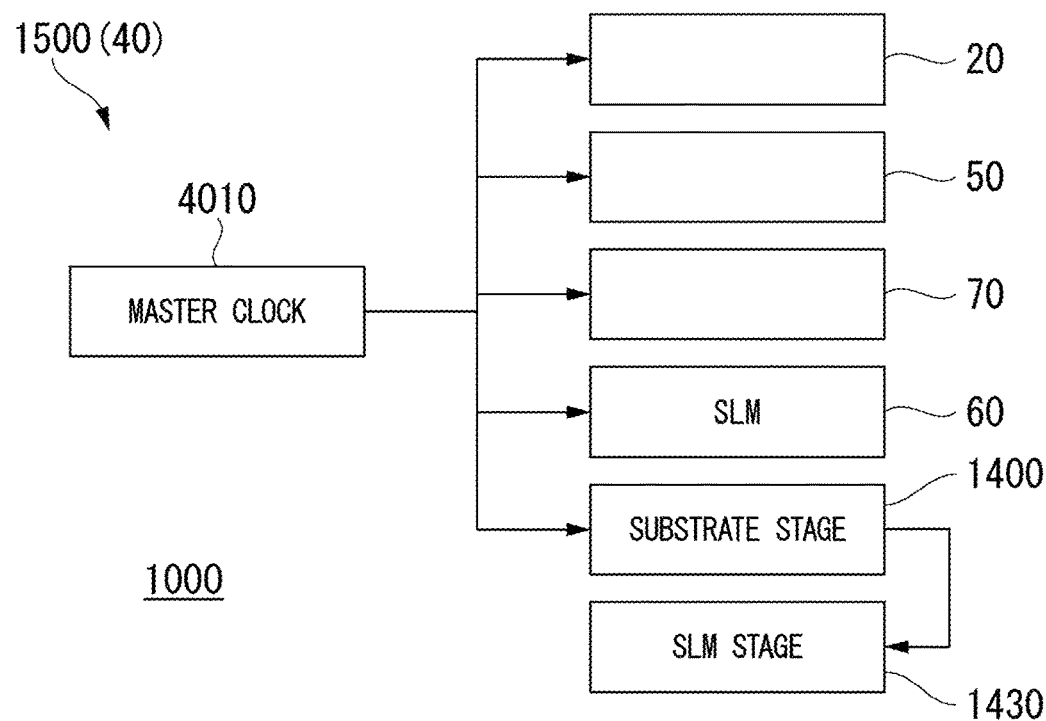
FIG. 36 is a view showing a configuration example of the exposure device related to synchronous control.
Figure 37:
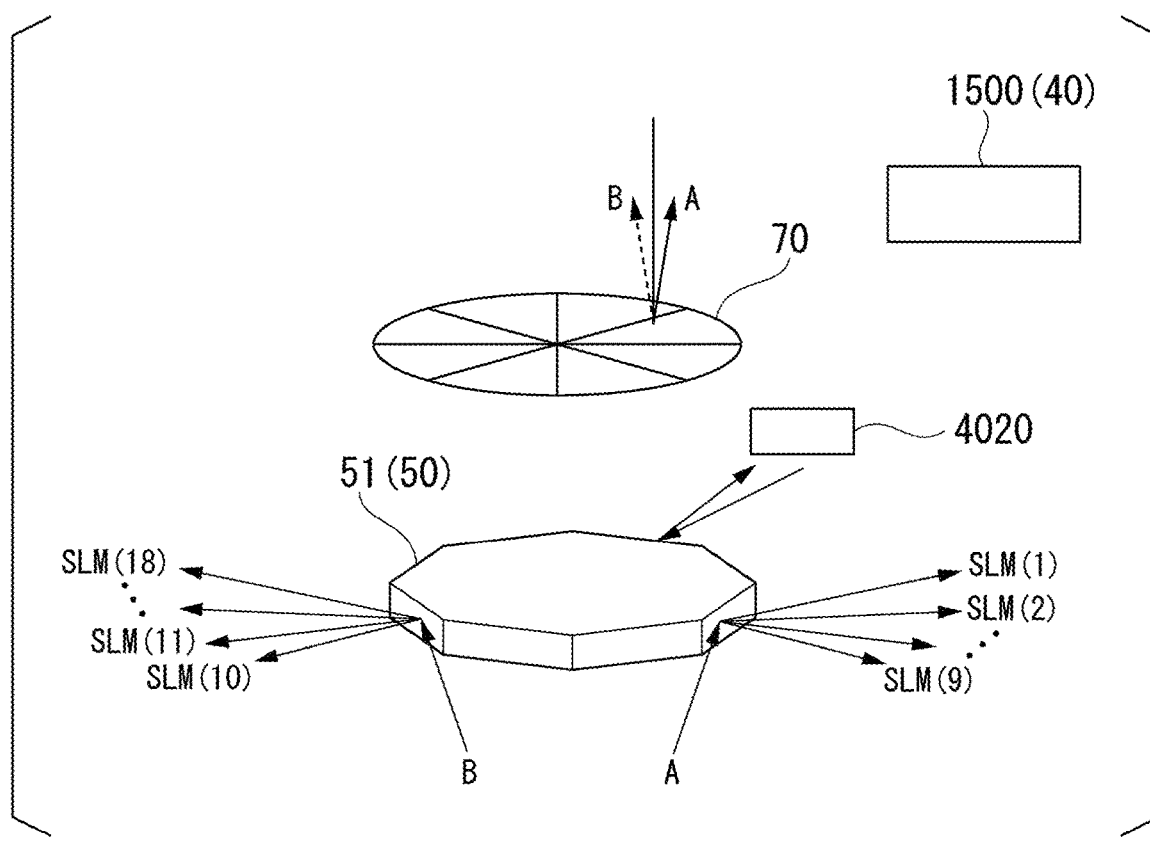
FIG. 37 is a view for describing an example of rotation control of a polygon mirror.

In the embodiment, as shown in FIG. 36, the exposure device 1000 includes a master clock (an oscillator configured to emit a master clock) 4010 that is a standard for synchronization. In the exposure device 1000 of FIG. 36, each device of at least the laser light source 20, the time divider (for example, the polygon mirror device) 50, the subsidiary divider (for example, the optical switch device) 70, the SLM (for example, the DMD) 60, and the substrate stage 1400 is driven using the master clock 4010 as the standard. As shown in FIG. 37, an origin sensor 4020 is provided on each of the devices according to necessity.

For example, in FIG. 37, the control system 1500 acquires information related to the rotation of the polygon mirror 51 based on the output data from the origin sensor 4020. The control system 1500 can control each device on the basis of the information from each device and the information from the master clock 4010.

Figure 38:
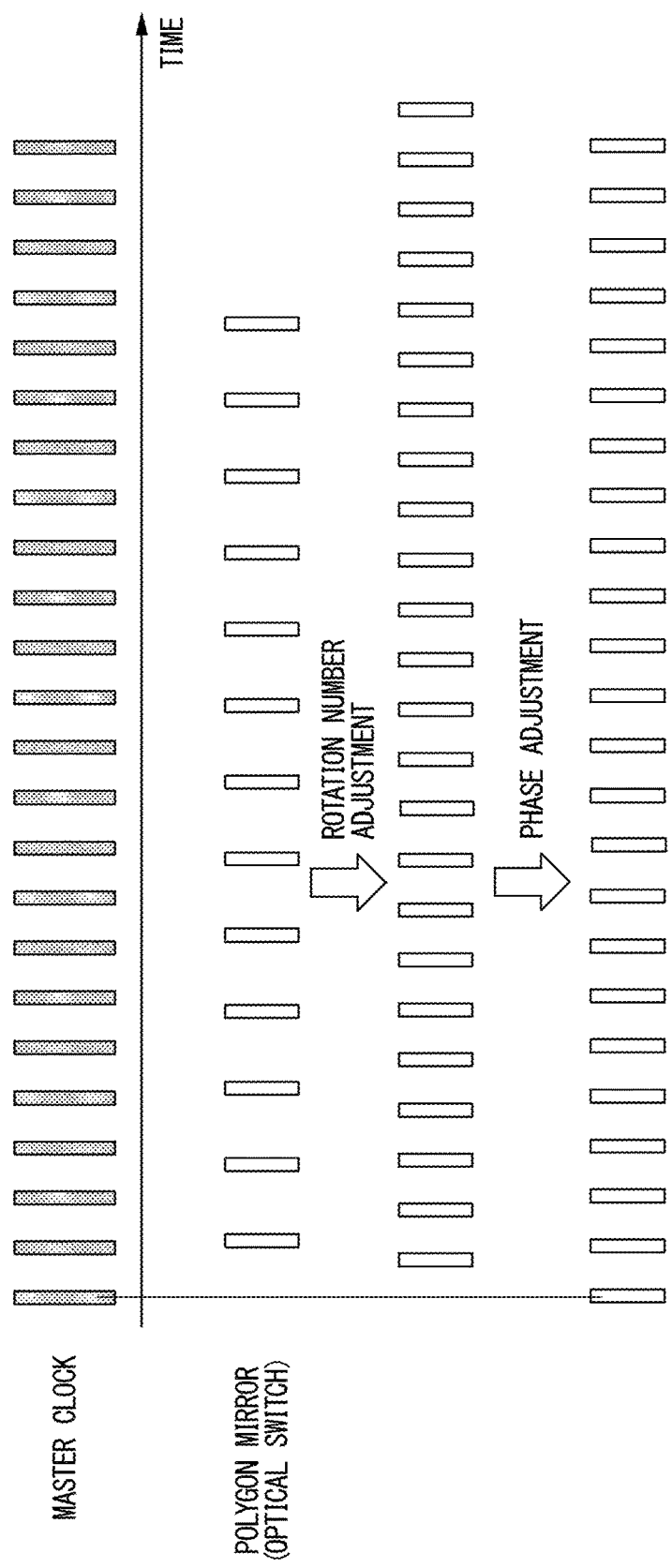
FIG. 38 is a view for describing an example of synchronous control of the polygon mirror.

As shown in FIG. 38, the control system 1500 adjusts the rotation number of the polygon mirror 51 to match the clock frequency of the master clock 4010 based on the rotation information of the polygon mirror 51. Further, the control system 1500 adjusts a phase of the polygon mirror 51 to match the clock timing of the master clock 4010. As a result, rotation of the polygon mirror 51 is controlled in synchronization with the master clock 4010. The subsidiary divider (the optical switch device 70) (FIG. 36) can also be adjusted similarly.

Figure 39:
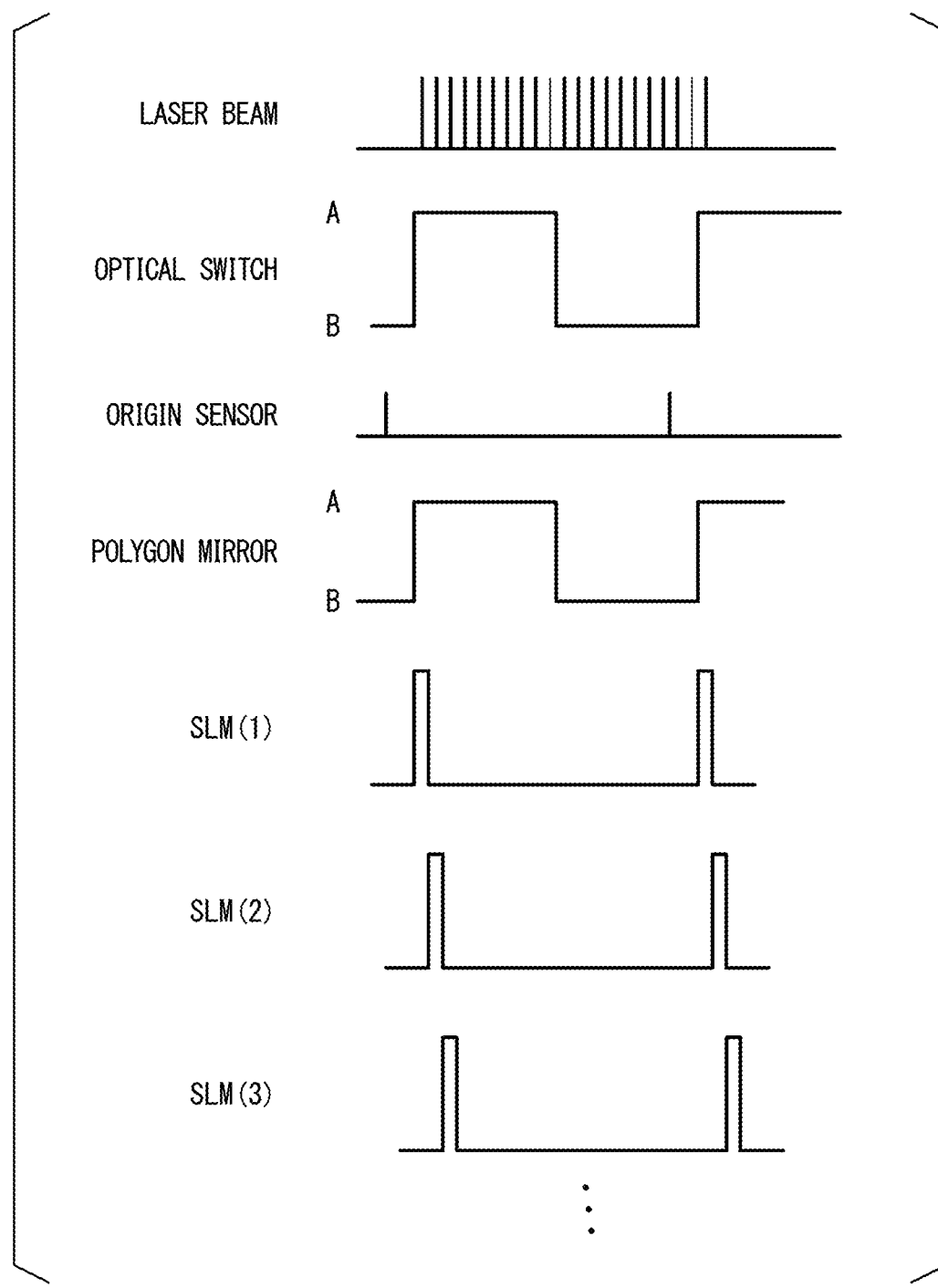
FIG. 39 is a view for describing an operation timing of a plurality of devices.

In addition, the control system 1500 can control a trigger signal of an image display start in the SLM 60, i.e., an image updating frequency, using the master clock 4010 as the standard. The control system 1500 can control the operation of the substrate stage 1400 that supports the substrate using the master clock 4010 as the standard. In addition, the control system 1500 can control an operation of an SLM stage 1430 that supports the SLM 60 to solve the positional deviation with the substrate stage 1400. By operating the SLM stage 1430, as described above, the position of the projection image projected on the substrate 1410 can be moved. As shown in FIG. 39, the operation timing of each device is individually adjusted as appropriate according to the reference of the master clock 4010, and a relation of the operation timing between the plurality of devices is appropriately set.

Here, in the time divider 50 and the subsidiary divider 70, when the beam enters a boundary portion between the plurality of regions provided for time division, the emitted beam may be unstable. For example, in the rotation plate 55 shown in FIG. 9(*b*) above, when the beam enters an apex section or a bottom section located at a boundary portion between the first reflecting surface 56 and the second reflecting surface 57, the reflected beam may be scattered or the direction of the beam may be disturbed.

Figure 40:
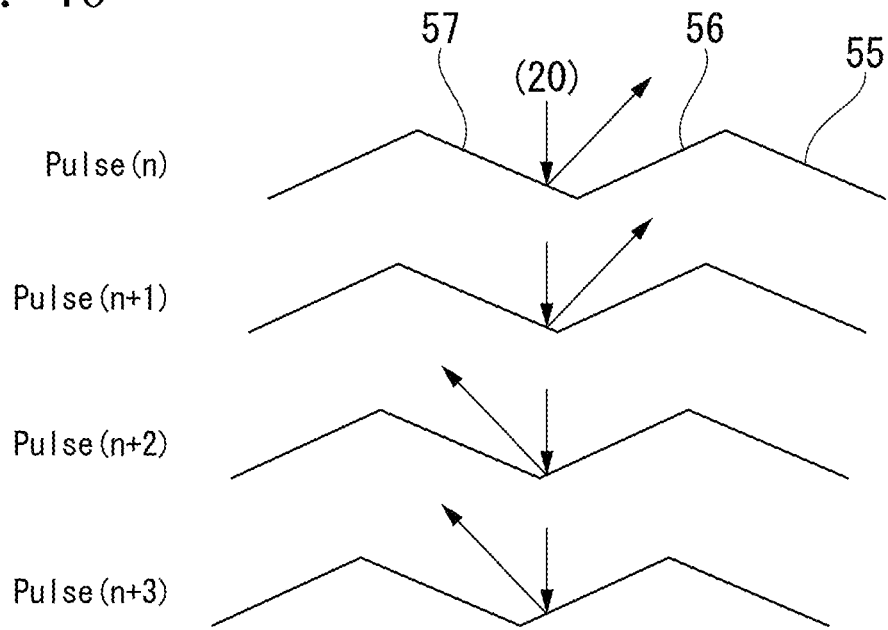
FIG. 40 is a view for describing an example of synchronous control of a rotation plate.

As shown in FIG. 40, by appropriately controlling the rotation of the rotation plate 55 according to the oscillation timing of the laser light source 20, the beam entering into the boundary portion between the first reflecting surface 56 and the second reflecting surface 57 in the rotation plate 55 are avoided. For example, at the timing between a $(n+1)^{th}$ pulse and a $(n+2)^{th}$ pulse, the rotation of the rotation plate 55 is controlled such that an optical boundary (the uppermost section or the lowermost section) in the rotation plate 55 is located at the target irradiation position of the beam. Accordingly, use efficiency of the beam is improved.

Figure 41:
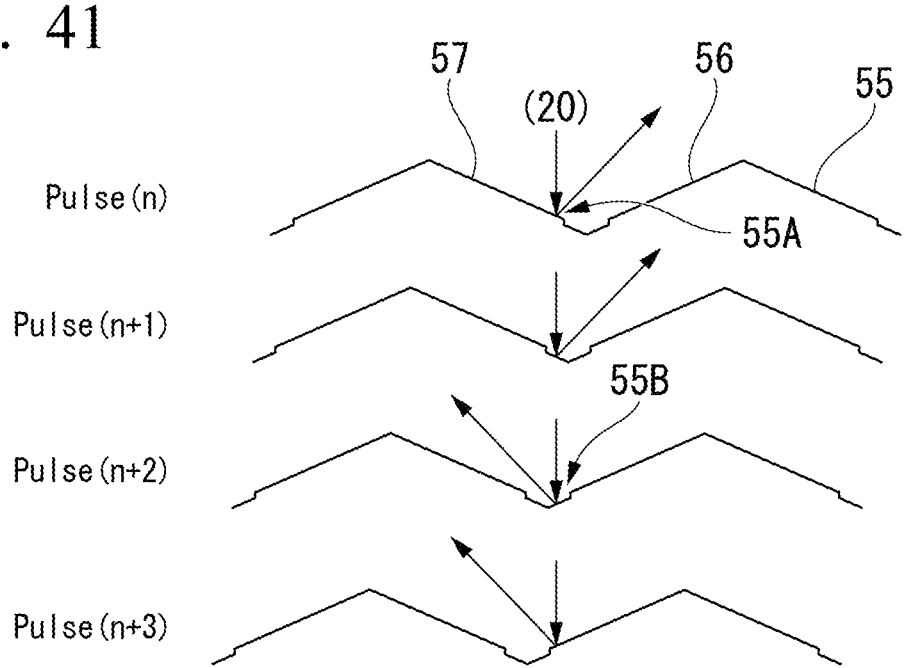
FIG. 41 is a view for describing an example of synchronous control of the rotation plate on which additional machining is performed.

Alternatively and/or additionally, the optical boundary for division in the time divider 50 (or the subsidiary divider 70) may be obtained by performing machining different from the other region. In the example, as shown in FIG. 41, additional machining is performed in the vicinity of the boundary (in the vicinity of the bottom section) between the first reflecting surface 56 and the second reflecting surface 57 in the rotation plate 55. For example, additional machining with relatively high accuracy is performed in the vicinity of the boundary of the rotation plate 55. Use efficiency of the beam is improved based on high surface accuracy in the region in the vicinity of the optical boundary.

In the example of FIG. 41, step differences 55A and 55B as traces of additional machining are formed in the vicinity of the boundary (in the vicinity of the bottom section) between the first reflecting surface 56 and the second reflecting surface 57 in the rotation plate 55. By appropriately controlling the rotation of the rotation plate 55 according to the oscillation timing of the laser light source 20, entering of the beam to the step differences 55A and 55B in the rotation plate 55 is avoided. For example, the rotation of the rotation plate 55 is controlled such that the step difference 55A in the rotation plate 55 is located at the target irradiation position of the beam at a timing between a $(n)^{th}$ pulse and a $(n+1)^{th}$ pulse. In addition, the rotation of the rotation plate 55 is controlled such that the step difference 55B in the rotation plate 55 is located at the target irradiation position of the beam at a timing between a $(n+2)^{th}$ pulse and a $(n+3)^{th}$ pulse.

In the embodiment, an exposure device (1000) configured to expose a predetermined pattern on a substrate includes a light source (20), a spatial light modulator (60) configured to spatially modulate the light from the light source (20) on the basis of pattern data that describes a predetermined pattern, a projection optical system (1330) configured to project an projection image of a spatially modulated light to the substrate, and an optical path switching machine (50, 70) that is configured to switch an optical path of light sequentially oscillated from the light source (20) and that is configured to switch the optical path of the light so as to sequentially guide the light to the spatial modulators (60) which are provided in plural, and the optical path switching machine (50, 70) has a first switching machine (70) configured to switch the optical path to any one of a first optical path and a second optical path, and a second switching machine (50) that is configured to guide the light guided to the first optical path to a spatial light modulator (60) of a first group among the plurality of spatial light modulators and that is configured to guide the light guided to the second optical path to a spatial modulator (60) of a second group among the plurality of spatial light modulators.

In the example, the first switching machine (70) has a first region configured to guide the light oscillated from the light source (20) within a first period to the first optical path, and a second region configured to guide the light oscillated from the light source (20) within a second period, which is different from the first period, to the second optical path.

For example, the first region reflects the light, and the second region transmits the light.

For example, the first region is provided to be inclined with respect to the light at a first angle and reflects the light to guide the light to the first optical path, and the second region is provided to be inclined with respect to the light at a second angle different from the first angle and reflects the light to guide the light to the second optical path.

In another example, the second switching machine (50) has a first reflecting surface (52A) configured to reflect the light to the spatial light modulator (60) of the first group, and a second reflecting surface (52B) configured to reflect and guide the light to the spatial light modulator (60) of the second group.

The second switching machine (50) has a first switching machine (50, 51A) configured to guide the light to the spatial light modulator (60) of the first group, and a second switching machine (50, 51B) configured to guide the light to the spatial light modulator (60) of the second group.

Alternatively and/or additionally, the exposure device (1000) includes a data transmission unit (1500) configured to transmit the pattern data to the spatial light modulator (60), the spatial light modulator (60) has a first spatial light modulator (60) and a second spatial light modulator (60) that are provided in plural side by side in a second direction which is a direction that crosses a first direction in which the substrate is moved during exposure, and the data transmission unit (1500) divides the pattern data into first pattern data transmitted to the first spatial light modulator (60) and second pattern data transmitted to the second spatial light modulator (60), and relatively shifts positions of the first pattern data and the second pattern data related to the first direction.

Alternatively and/or additionally, the exposure device (1000) includes a data transmission unit (1500) configured to transmit the pattern data to the spatial light modulator (60), the spatial light modulator (60) has a first spatial light modulator (60) and a second spatial light modulator (60), and the data transmission unit (1500) divides the pattern data into first pattern data transmitted to the first spatial light modulator (60) and second pattern data transmitted to the second spatial light modulator (60), and relatively shifts positions of the first pattern data and the second pattern data.

For example, the second switching machine (50) is a polygon mirror.

In the embodiment, the exposure device (1000) exposes a predetermined pattern to a substrate that is moving in a first direction via the first spatial light modulator (60) and the second optical modulator (60) disposed side by side in a second direction, which is a direction that crosses the first direction. The exposure device (1000) includes a light source (20), a data transmission unit (1500) configured to transmit pattern data described on the basis of the predetermined pattern to the first spatial light modulator (60) and the second spatial light modulator (60), a first projection optical system (1330) configured to project a projection image of a light, which is from the light source (20) and which is spatially modulated by the first spatial modulator (60), to the substrate on the basis of the first pattern data, which is a part of the pattern data, transmitted by the transmission unit (1500), the second spatial light modulator (60) configured to spatially modulate the light which is from the light source (20) on the basis of the second pattern data, which is the other part of the pattern data, transmitted by the transmission unit (1500), a second projection optical system (1330) configured to project a projection image of the secondarily spatially modulated light to the substrate, and an optical path switching machine (50) configured to switch an optical path of the light sequentially oscillated from the light source (20) and guides the light in sequence of the first spatial modulator (60) and the second spatial modulator (60), and the data transmission unit (1500) divides the pattern data into the first pattern data and the second pattern data and relatively shifts positions of the first pattern data and the second pattern data related to the first direction.

In the example, the exposure device (1000) includes an oscillator (4010) configured to emit a master clock that synchronizes at least two of the light source (20), the spatial light modulator (60) and the optical path switching machine (50).

For example, the exposure device further includes a synthesizer (1200) configured to synthesize the light emitted from each of the plurality of light sources (20), and the optical path switching machine (50) switches the optical path of the light synthesized by the synthesizer (1200).

In the embodiment a method for manufacturing a flat panel display includes exposing the substrate using the exposure device (1000), and developing the exposed substrate.

In the embodiment, a method for manufacturing a device includes exposing the substrate using the exposure device (1000), and developing the exposed substrate.

Further, the exposure device 1000 may also be used as, for example, a semiconductor photolithography system for exposing an integrated circuit pattern on a wafer or a photolithography system for manufacturing a thin film magnetic head.

Further, while it has been described in the above-mentioned plurality of embodiments that beam output with a low frequency and high energy is realized by a combination of synthesis and time division of a plurality of beams, there is no limitation thereto. When the beams with high energy are output from the laser light source, the plurality of beams may not be synthesized.

Further, the synthesis of the plurality of beams includes a case in which optical axes of the laser beams emitted from the plurality of light sources are matched and synthesized. In addition, even when the optical axes of the laser beams emitted from the plurality of light source do not match each other, the case in which these optical axes are substantially close to each other includes that the beams with high energy are output or that the beams are synthesized.

The above-mentioned photolithography system can be constructed to assemble various sub-systems such that predetermined mechanical accuracy, electrical accuracy, and optical accuracy are maintained. In order to maintain the various types of accuracy before and after the assembly, each of the optical systems is adjusted to accomplish the optical accuracy thereof. Similarly, all mechanical systems and electrical systems are adjusted to accomplish mechanical accuracy and electrical accuracy. In a process of assembling the sub-systems to the photolithography system, a mechanical interface between the sub-systems, electric circuit wiring connection, and pneumatic pressure pipeline connection are included. Prior to assembly of the photolithography system from various sub-systems, a process of assembling the sub-systems is also provided. Once various sub-systems are used and a photolithography system is assembled, all adjustments are performed in order to reliably maintain the accuracy in a complete photolithography system. Further, it is desired to manufacture an exposure system in a clean room in which a temperature and cleanliness are controlled.

In addition, the substrate to be exposed is not limited to the glass plate, and another substance such as a wafer, a ceramic substrate, a film member, mask blanks, or the like, may be provided. In addition, when an exposure object is a substrate for a flat panel display, a thickness of the substrate is not particularly limited, and for example, a member having a film shape (a sheet-shaped member having flexibility) is also included. Further, the exposure device of the embodiment is particularly effective when a substrate with a single side or a diagonal length of 500 mm or more is an exposure object.

An electronic device such as a liquid crystal display element (or a semiconductor element) or the like is manufactured through a step of performing a function/performance design of the device, a step of fabricating a mask (or a reticule) on the basis of the design step, a step of fabricating a glass substrate (or a wafer), a lithography step of transferring a pattern of the mask (reticule) to the glass substrate using the exposure device of the above-mentioned embodiment and an exposure method thereof, a development step of developing the exposed glass substrate, an etching step of removing an exposure member of a portion other than a portion in which resist is remained by etching, a resist removal step of removing the resist that is no longer needed after etching, a device assembly step, an inspection step, and the like. In this case, in the lithography step, since the above-mentioned exposure method is executed using the exposure device of the embodiment and the device pattern is formed on the glass substrate, highly integrated devices can be manufactured with high productivity.

The system of the present disclosure described above can achieve the purpose and provide the effect. These are examples of the embodiment, and there is no intention to limit the configuration or design in detail.

What is claimed is:

1. An exposure device configured to expose a substrate, the exposure device comprising:
a first light source;
a plurality of spatial light modulators each of which is configured to spatially modulate an incident beam based on pattern data; and
an optical path switching machine configured to switch an optical path of light from the first light source so as to sequentially guide the light to the plurality of spatial light modulators,
wherein the optical path switching machine comprises:
a first switching machine configured to switch the optical path to one of a first optical path and a second optical path; and
a second switching machine (i) that is configured to guide the light guided to the first optical path by the first switching machine to spatial light modulators of a first group among the plurality of spatial light modulators and (ii) that is configured to guide the light guided to the second optical path by the first switching machine to spatial light modulators of a second group among the plurality of spatial light modulators.

2. The exposure device according to claim 1, wherein the first switching machine comprises a first region configured to guide the light from the first light source within a first period to the first optical path, and the first switching machine comprises a second region configured to guide the light from the first light source within a second period, which is different from the first period, to the second optical path.

3. The exposure device according to claim 2,
wherein the first region is configured to reflect the light, and
the second region is configured to transmit the light.

4. The exposure device according to claim 2,
wherein the first region is inclined with respect to the light at a first angle so as to reflect and guide the light to the first optical path, and
wherein the second region is inclined with respect to the light at a second angle different from the first angle so as to reflect and guide the light to the second optical path.

5. The exposure device according to claim 1, wherein the second switching machine comprises a first reflecting surface configured to reflect the light to the spatial light modulators of the first group, and the second switching machine comprises a second reflecting surface configured to reflect the light to the spatial light modulators of the second group.

6. The exposure device according to claim 1, wherein the second switching machine comprises a first switching machine configured to guide the light to the spatial light modulators of the first group, and the second switching machine comprises a second switching machine configured to guide the light to the spatial light modulators of the second group.

7. The exposure device according to claim 1, further comprising a data transmission unit configured to (i) divide device pattern data into first pattern data transmitted to a first spatial light modulator of the plurality of spatial light modulators and second pattern data transmitted to a second spatial light modulator of the plurality of spatial light modulators, the first spatial light modulator and the second spatial light modulator being arranged in a second direction crossing a first direction in which the substrate moves during exposure, and (ii) relatively shift positions of the first pattern data and the second pattern data related to the first direction.

8. The exposure device according to claim 1, further comprising a data transmission unit configured to (i) divide device pattern data into first pattern data transmitted to a first spatial light modulator of the plurality of spatial light modulators and second pattern data transmitted to a second spatial light modulator of the plurality of spatial light modulators and (ii) relatively shift positions of the first pattern data and the second pattern data.

9. The exposure device according to claim 1, wherein the second switching machine is a polygon mirror.

10. An exposure device configured to expose a substrate while moving the substrate in a first direction, the exposure device comprising:
a first light source;
a first spatial light modulator and a second spatial light modulator that are arranged in a second direction crossing the first direction and into which light from the first light source enters;
a data transmission unit configured to transmit first pattern data to the first spatial light modulator and second pattern data to the second spatial light modulator;
a first projection optical system configured to project an image formed on the first spatial light modulator based on the first pattern data to the substrate;
a second projection optical system configured to project an image formed on the second spatial light modulator based on the second pattern data to the substrate; and
an optical path switching machine configured to switch an optical path of the light from the first light source so as to sequentially guide the light to the first spatial light modulator and the second spatial light modulator,
wherein the data transmission unit is configured (i) to divide device pattern data into the first pattern data and the second pattern data and (ii) relatively shift positions of the first pattern data and the second pattern data related to the first direction.

11. The exposure device according to claim 1, further comprising an oscillator configured to emit a master clock that synchronizes at least two selected from the group consisting of the first light source, the spatial light modulators, and the optical path switching machine.

12. The exposure device according to claim 1, further comprising:
a second light source; and
a synthesizer configured to synthesize the light from the first light source and light from the second light source,
wherein the optical path switching machine is configured to switch an optical path of the light synthesized by the synthesizer.

13. A method for manufacturing a flat panel display comprising:
exposing the substrate using the exposure device according to claim 1; and
developing the exposed substrate.

14. A method for manufacturing a device comprising:
exposing the substrate using the exposure device according to claim 1; and
developing the exposed substrate.

15. The exposure device according to claim 1, further comprising:
a plurality of projection optical systems each of which is configured to project an image formed on a respective spatial light modulator of the plurality of spatial light modulators based on the pattern data, to the substrate.

16. The exposure device according to claim 10, further comprising an oscillator configured to emit a master clock that synchronizes at least two selected from the group consisting of the first light source, the first and second spatial light modulators, and the optical path switching machine.

17. The exposure device according to claim 10, further comprising:
- a second light source; and
- a synthesizer configured to synthesize the light from the first light source and light from the second light source, wherein the optical path switching machine is configured to switch an optical path of the light synthesized by the synthesizer.

18. A method for manufacturing a flat panel display comprising:
- exposing the substrate using the exposure device according to claim 10; and
- developing the exposed substrate.

19. A method for manufacturing a device comprising:
- exposing the substrate using the exposure device according to claim 10; and
- developing the exposed substrate.

* * * * *

UNITED STATES PATENT AND TRADEMARK OFFICE
CERTIFICATE OF CORRECTION

| | |
|---|---|
| PATENT NO. | : 11,899,372 B2 |
| APPLICATION NO. | : 17/859140 |
| DATED | : February 13, 2024 |
| INVENTOR(S) | : Yasushi Mizuno et al. |

It is certified that error appears in the above-identified patent and that said Letters Patent is hereby corrected as shown below:

On the Title Page

Item (56), under U.S. PATENT DOCUMENTS, insert:
-- 2004/0130561 A1 7/2004 Jain
2013/0050803 A1 2/2013 Stowe et al. --

Item (56), under FOREIGN PATENT DOCUMENTS, insert:
-- EP 2560362 A2 2/2013 --

Item (56), under OTHER PUBLICATIONS, insert:
-- January 17, 2024 Office Action issued in European Patent Application No. 21738415.5. --

Signed and Sealed this
Sixteenth Day of July, 2024

Katherine Kelly Vidal
*Director of the United States Patent and Trademark Office*